US012757497B2

(12) United States Patent
Thomson et al.

(10) Patent No.: US 12,757,497 B2
(45) Date of Patent: Oct. 6, 2026

(54) ELECTROSTATIC DISCHARGE (ESD) PROTECTION DEVICE WITH A TARGETED SUB-FIN ETCH DEPTH

(71) Applicant: Intel Corporation, Santa Clara, CA (US)

(72) Inventors: Nicholas A. Thomson, Hillsboro, OR (US); Ayan Kar, Portland, OR (US); Kalyan C. Kolluru, Portland, OR (US); Mauro J. Kobrinsky, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 153 days.

(21) Appl. No.: 17/943,815

(22) Filed: Sep. 13, 2022

(65) Prior Publication Data

US 2024/0088134 A1 Mar. 14, 2024

(51) Int. Cl.
*H10D 89/60* (2025.01)
*H10D 84/01* (2026.01)
*H10D 84/03* (2025.01)

(52) U.S. Cl.
CPC ......... *H10D 89/811* (2025.01); *H10D 84/013* (2025.01); *H10D 84/0151* (2025.01); *H10D 84/038* (2025.01)

(58) Field of Classification Search
CPC ............. H10D 89/811; H10D 84/0151; H10D 84/013; H10D 84/038
USPC ......................................................... 257/276
See application file for complete search history.

(56) References Cited

U.S. PATENT DOCUMENTS

| | | | | |
|---|---|---|---|---|
| 2019/0131395 A1* | 5/2019 | Lee | H10D 64/017 |
| 2022/0139903 A1* | 5/2022 | Hung | H10D 84/0193 257/355 |
| 2022/0392894 A1* | 12/2022 | More | H10D 84/013 |
| 2023/0178539 A1* | 6/2023 | Frougier | H10D 30/6757 257/401 |
| 2023/0420443 A1* | 12/2023 | Thomson | H01L 21/02603 |
| 2024/0332282 A1* | 10/2024 | Yu | H10D 89/711 |

* cited by examiner

*Primary Examiner* — Eliseo Ramos Feliciano
*Assistant Examiner* — Timothy Edward Duren
(74) *Attorney, Agent, or Firm* — Arcane Law PLLC

(57) ABSTRACT

An integrated circuit structure includes laterally adjacent first and second devices. The first device has (i) a first diffusion region, (ii) a first body including semiconductor material extending laterally from the first diffusion region, and (iii) a first gate structure on the first body. The first diffusion region has a first lower section that extends below a lower surface of the first gate structure, the first lower section having a first height. The second device has (i) a second diffusion region, (ii) a second body including semiconductor material extending laterally from the second diffusion region, and (iii) a second gate structure on the second body. The second diffusion region has a second lower section that extends below a lower surface of the second gate structure, the second lower section having a second height. In an example, the first height is at least 2 nanometers greater than the second height.

20 Claims, 16 Drawing Sheets

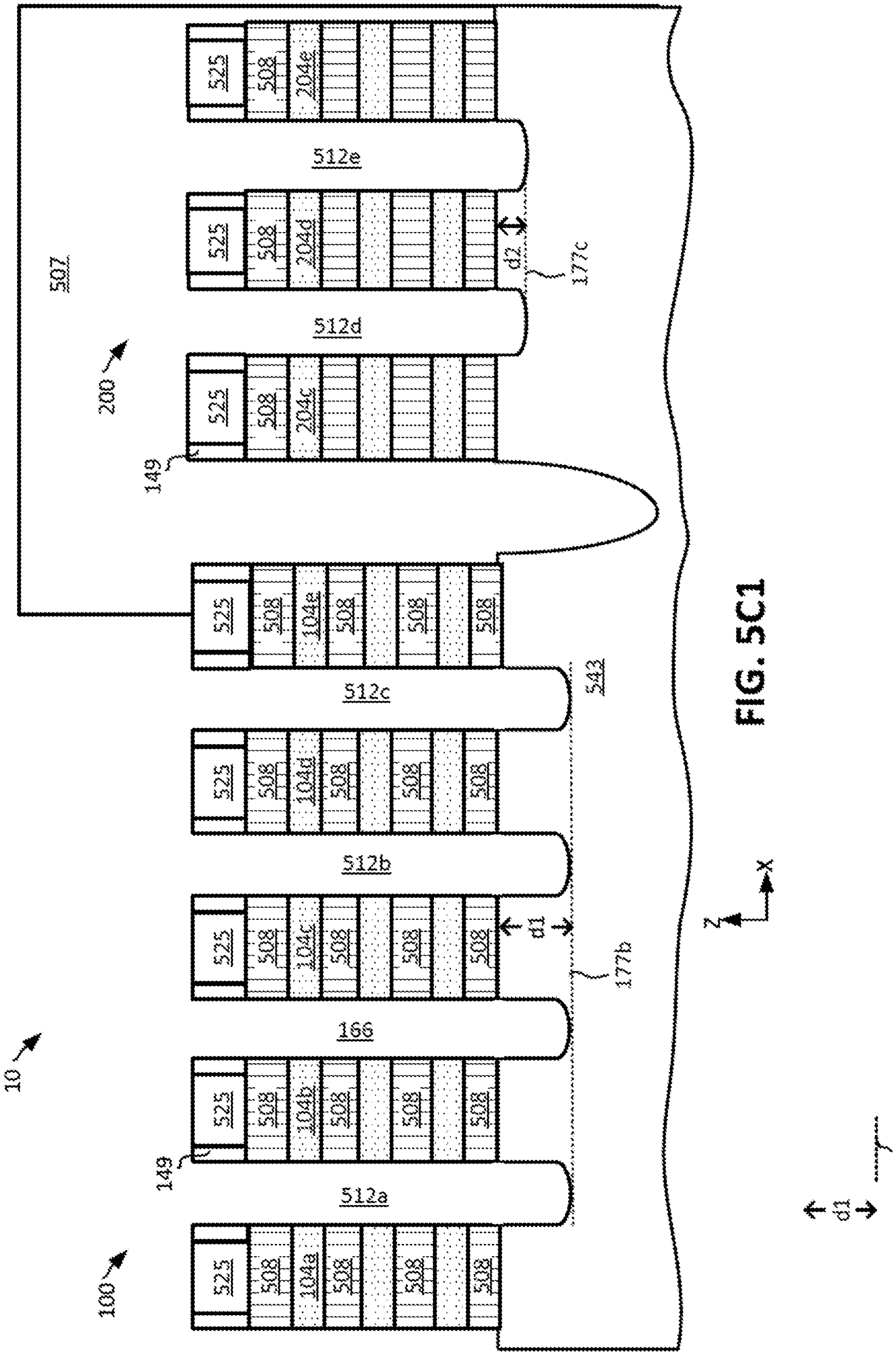
FIG. 5C1

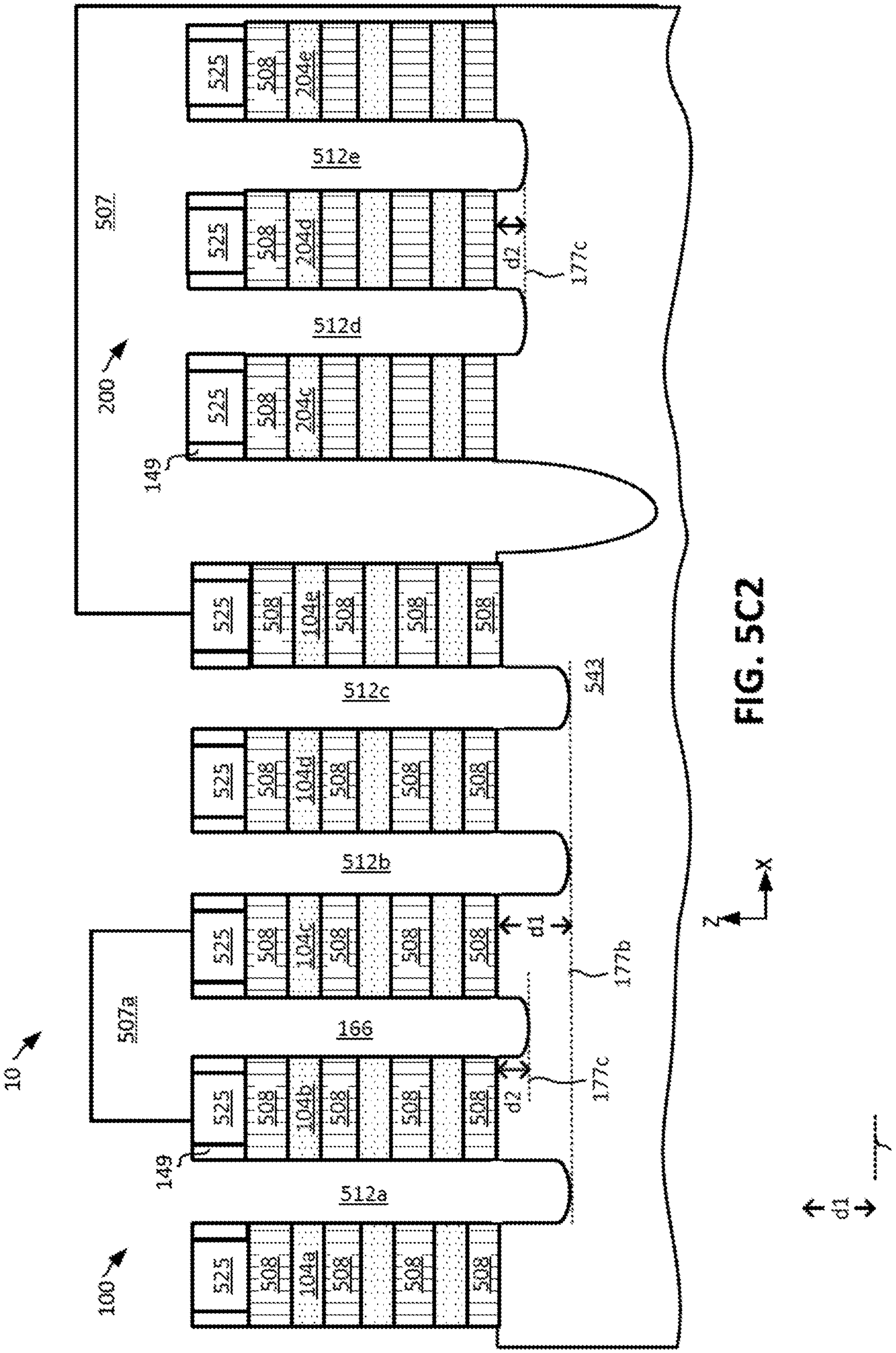
FIG. 5C2

ELECTROSTATIC DISCHARGE (ESD) PROTECTION DEVICE WITH A TARGETED SUB-FIN ETCH DEPTH

FIELD OF THE DISCLOSURE

The present disclosure relates to integrated circuits, and more particularly, to devices including sub-fins.

BACKGROUND

During an electrostatic discharge (ESD) event in an integrated circuit (IC), an input/output (I/O) terminal may experience high voltage. Various ESD protection devices are used, e.g., to protect the IC from failure during the ESD event. For example, transistors and/or diodes may be used as an EDS protection device in high-speed I/O designs, where the high voltage is grounded through these devices. In an example, an ESD protection device may be used to conduct current to a ground terminal, during an ESD event at an I/O terminal of the IC. Designing ESD protection devices involves many non-trivial issues.

BRIEF DESCRIPTION OF THE DRAWINGS

FIGS. 5A, 5B, 5C, 5C1, 5C2, 5D, 5E, 5F, 5G, and 5H collectively illustrate cross-sectional views of the portion of the integrated circuits in various stages of processing in accordance with the methodology of FIG. 4, in accordance with an embodiment of the present disclosure.

Figure 1A:
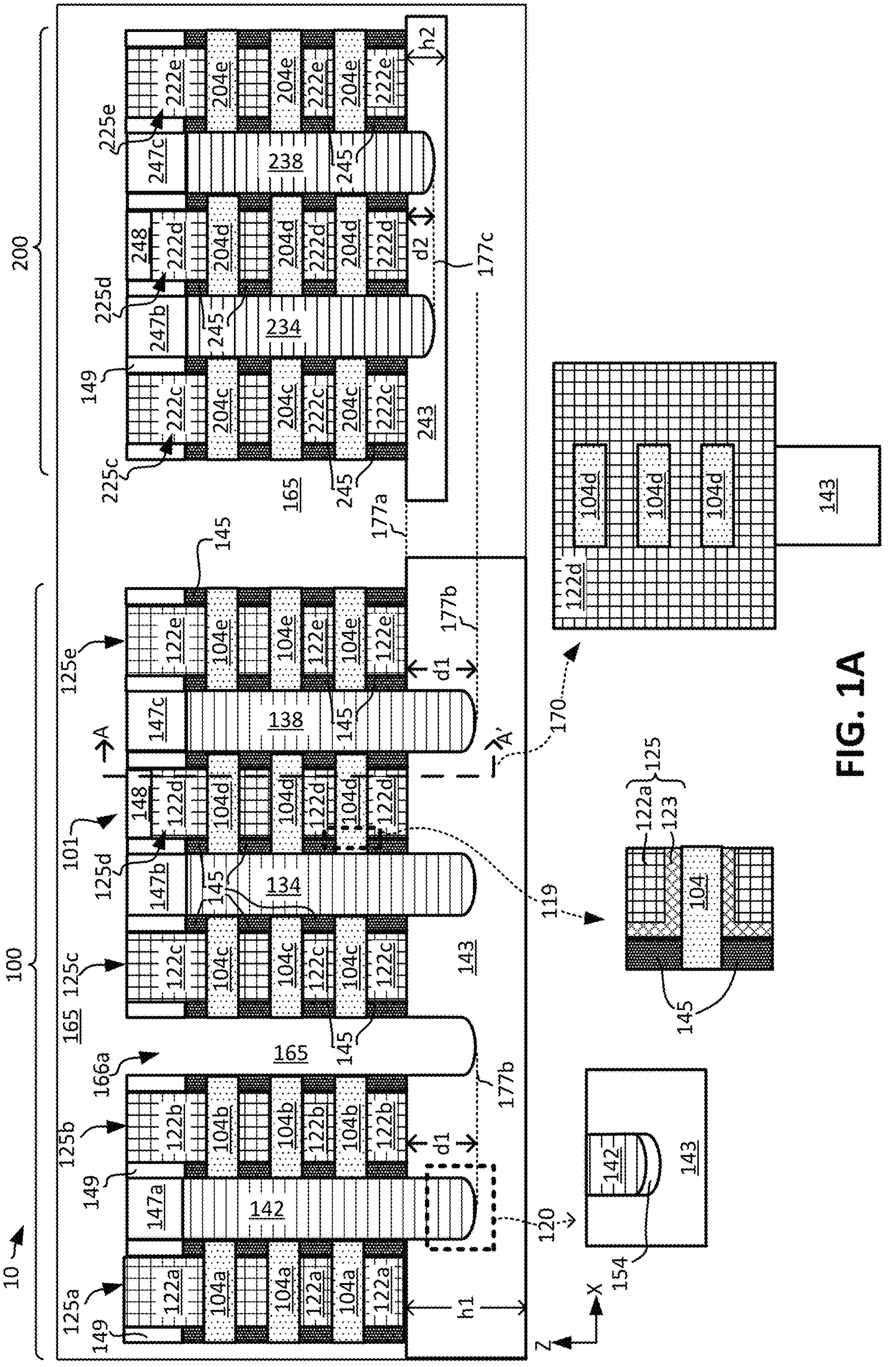
FIG. 1A illustrates a cross-sectional view of a portion of an integrated circuit comprising (i) a first device that is usable for ESD protection of the integrated circuit, and (ii) a second device laterally adjacent to the first device, where the first device comprises a first plurality of diffusion regions in contact with a sub-fin, where the first device uses the sub-fin for current conduction and for ESD protection of the integrated circuit, where the second device comprises a second plurality of diffusion regions in contact with a component that is at a bottom section of the second device, where one or more (e.g., all) of the first plurality of diffusion regions of the first device extend to a distance d1 below a lower surface of one or more gate structures of the first device, where one or more (e.g., all) of the second plurality of diffusion regions of the second device extend to a distance d2 below a lower surface of one or more gate structures of the second device, and where the distance d1 is at least 2 nm greater than the distance d2, in accordance with an embodiment of the present disclosure.

As will be appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., some features may have tapered sidewalls and/or rounded corners), and some features may have surface topology or otherwise be non-smooth, given real world limitations of the processing equipment and techniques used. Likewise, while the thickness of a given first layer may appear to be similar in thickness to a second layer, in actuality that first layer may be much thinner or thicker than the second layer; same goes for other layer or feature dimensions.

DETAILED DESCRIPTION

Integrated circuit structures including devices that use sub-fins for current conduction are provided herein. In an example, one or more diffusion regions of such a device extends relatively deeply within the corresponding sub-fin, e.g., to make better electrical contact (e.g., lower resistance) with the sub-fin. The structures can be use in any number of applications, but are particularly well-suited for ESD protection devices. In one embodiment, an integrated circuit structure comprises laterally adjacent first and second devices. The first device comprises (i) a first diffusion region, (ii) a first body comprising semiconductor material extending laterally from the first diffusion region, and (iii) a first gate structure on the first body. The first diffusion region has a lower section that extends below a lower surface of the first gate structure, the lower section of the first diffusion region having a first vertical height. The second device comprises (i) a second diffusion region, (ii) a second body comprising semiconductor material extending laterally from the second diffusion region, and (iii) a second gate structure on the second body. The second diffusion region has a lower section that extends below a lower surface of the second gate structure, the lower section of the second diffusion region having a second vertical height. In one such example, the first vertical height is at least 2 nanometers (nm) greater than the second vertical height. In an example, the first device is an ESD protection device, such as one configured to conduct current during an ESD event occurring at an input/output (I/O) terminal of the integrated circuit structure, the I/O terminal coupled to the first diffusion region.

In another embodiment, an integrated circuit structure comprises a first device laterally adjacent to a second device. The first device comprises (i) a first sub-fin, and (ii) a first diffusion region in contact with and extending in part within the first sub-fin. The portion of the first diffusion region extending within the first sub-fin has a first height. The second device comprises (i) a second sub-fin, and (ii) a second diffusion region in contact with and extending in part within the second sub-fin. The portion of the second diffusion region extending within the second sub-fin has a second height. In one such example, the first height is at least 2 nanometers (nm) greater than the second height.

In yet another embodiment, an integrated circuit structure comprises a first device laterally adjacent to a second device. The first device comprises (i) a sub-fin, (ii) first one or more diffusion regions in contact with the sub-fin, and (iii) a trench laterally adjacent to the first one or more diffusion regions. The trench comprises dielectric material and has (a) an upper section extending upward from the sub-fin, and (b) a lower section extending within the sub-fin, wherein the lower section of the trench has a first vertical height. The second device comprises (i) a second diffusion region, (ii) a body comprising semiconductor material extending laterally from the second diffusion region, and (iii) a gate structure on the body. The second diffusion region has a lower section that extends below a lower surface of the second gate structure, the lower section of the second diffusion region having a second vertical height. In one such example, the first vertical height is at least 2 nanometers (nm) greater than the second vertical height. Numerous configurations and variations will be apparent in light of this disclosure.

General Overview

As mentioned herein above, there are various non-trivial issues associated with designing ESD protection devices. For example, utilizing the underlying bulk substrate as a current path for an ESD protection device increases the performance of the ESD protection device. As an example, in a gate-all-around (GAA) or a fin-based device, using the underlying bulk substrate for current conduction during an ESD event increases the current carrying capability of the device, due to relatively large cross sectional area of the bulk substrate as compared to the channel region. However, configurations where bulk substrate is removed cannot accommodate such ESD approaches. Moreover, with ever-shrinking gate pitch, forming relatively low resistance contacts with the bulk substrate is becoming increasingly challenging.

Accordingly, techniques are provided herein to form an ESD protection device in which diffusion regions extend within a corresponding sub-fin region, thereby resulting in better contact between the diffusion regions and the sub-fin of the ESD protection device. For example, during formation of the ESD protection device, diffusion region trenches (e.g., see FIGS. 5C1, 5C2) for eventual formation of the diffusion regions of the ESD protection device are made to extend deeper within the corresponding sub-fin (e.g., to a depth of d1, see FIG. 1A). Accordingly, when the diffusion regions are formed (e.g., epitaxially grown, see FIG. 5D), there is relatively more semiconductor (e.g., comprising silicon) sub-fin to promote better epitaxial growth of the various diffusion regions. This leads to a more robust contact between a diffusion region and the sub-fin, where such a contact can handle relatively more current and achieve a relatively lower resistance.

Diffusion regions, as used herein, refer to doped regions comprising semiconductor material and formed during source or drain formation processes. Examples of diffusion region includes source and drain regions, body or tap regions, and/or anode and cathode regions of a diode based device.

In an example, an integrated circuit chip comprises an ESD protection device coupled to an I/O terminal of the integrated circuit chip. The ESD protection device is to protect the chip from an ESD event occurring at the I/O terminal. In an example, the ESD protection device is formed laterally adjacent to a transistor, where the transistor may not be exposed to ESD current (e.g., for not being coupled to an I/O terminal of the integrated circuit chip). For ease of identification and to better differentiate the transistor from the laterally adjacent ESD protection device, the transistor is termed herein as "logic device," and the transistor may be used for any appropriate logic and/or other function (such as memory, amplification, or signal processing) of the integrated circuit chip.

For example, the ESD protection device and the logic device may be laterally adjacent to each other. The ESD protection device and the logic device may be gate-all-around (GAA) devices in one example, where GAA channel regions include nanoribbons or other forms of channel regions (such as nanowires or nanosheets) around which a gate structure wraps. The ESD protection device and the logic device may be a fin-based device in another example, where the fin-based channel region is wrapped in part by a gate structure (e.g., a tri-gate like structure). As will be appreciated in light of this disclosure, reference to nanoribbons or GAA as channel regions is also intended to include other gate-all-around or multi-gate channel regions, such as nanowires, nanosheets, and other such semiconductor bodies around which a gate structure can at least partly wrap. To this end, the use of a specific channel region configuration (e.g., nanoribbon) is not intended to limit the present description to that specific channel configuration. Rather, the techniques provided herein can benefit any number of channel configurations, whether those bodies be nanowires, nanoribbons, nanosheets, or some other body around which a gate structure can at least partially wrap, such as the semiconductor bodies of a fin-based device.

In an example, the ESD protection device comprises first one or more diffusion regions, such as source and drain regions, tap or body regions, and/or anode and cathode regions, for example, depending on a type of the ESD protection device, such as an ESD protection diode, an ESD protection transistor, an ESD protection structure that integrates a diode with a transistor, or another appropriate ESD protection device. The logic device comprises second one or more diffusion regions, such as source and drain regions. In an example, in the ESD protection device, in addition to, or instead of, a GAA or fin-based channel region, a sub-fin is also used for ESD current conduction, as described herein. In contrast, in the logic device, the sub-fin may generally not be used for current conduction. Accordingly, in an example, the sub-fin of the ESD protection device may be thicker (e.g., having a greater vertical height) compared to the sub-fin of the logic device. For example, the sub-fin of the logic device may be at least partially etched from backside, to reduce the height of the sub-fin, so as to make space for backside interconnect features for power and/or signal routing, for example. In some examples, the sub-fin of the logic device may be completely removed, and replaced by a substrate or by dielectric material. Note that while the sub-fin for the logic device is being etched, the sub-fin for the ESD protection device may not be etched (or etched at a lower rate). Accordingly, the sub-fin of the ESD protection device has the greater thickness or vertical height than the sub-fin of the logic device.

In any case, the first one or more diffusion regions of the ESD protection device extend within the corresponding sub-fin by a depth of d1, e.g., see FIG. 1A. For example, each of the first one or more diffusion regions has a lower section that is below a lower surface of a gate structure of the ESD protection device, where a vertical height of the lower section of the first one or more diffusion regions is d1. Similarly, the second one or more diffusion regions of the logic device extend within the corresponding sub-fin by a depth of d2, e.g., see FIG. 1A. For example, each of the second one or more diffusion regions has a lower section that is below a lower surface of a gate structure of the logic device, where a vertical height of the lower section of the second one or more diffusion regions is d2. In an example, d1 is greater than d2 by at least at least 2 nm, or at least 4 nm, or at least 6 nm, or at least 8 nm, or at least 10 nm, or at least 15 nm, or at least 20 nm, or at least 25 nm.

In an example, the lower surface of the gate structure of the ESD protection device and the lower surface of the gate structure of the logic device may be substantially coplanar (e.g., vertically separated by at most 1 nm or 2 nm). Accordingly, in an example, an upper surface of the sub-fin of the ESD protection device and the upper surface of the sub-fin of the logic device may be substantially coplanar (e.g., vertically separated by at most 1 nm or 2 nm).

Because the first one or more diffusion regions of the ESD protection device extend deeper within the corresponding sub-fin than the second one or more diffusion regions of the logic device, in an example, a lower surface of the first one or more diffusion regions of the ESD protection device is at a lower level than a lower surface of the second one or more diffusion regions of the logic device. For example, a lower surface of the first one or more diffusion regions of the ESD protection device may be at least in part on a first horizontal plane, and a lower surface of the second one or more diffusion regions of the logic device may be at least in part on a second horizontal plane, where the first horizontal plane is lower than the second horizontal plane by at least 2 nm, or at least 4 nm, or at least 6 nm, or at least 8 nm, or at least 10 nm, or at least 15 nm, or at least 20 nm, or at least 25 nm.

Figure 5A:
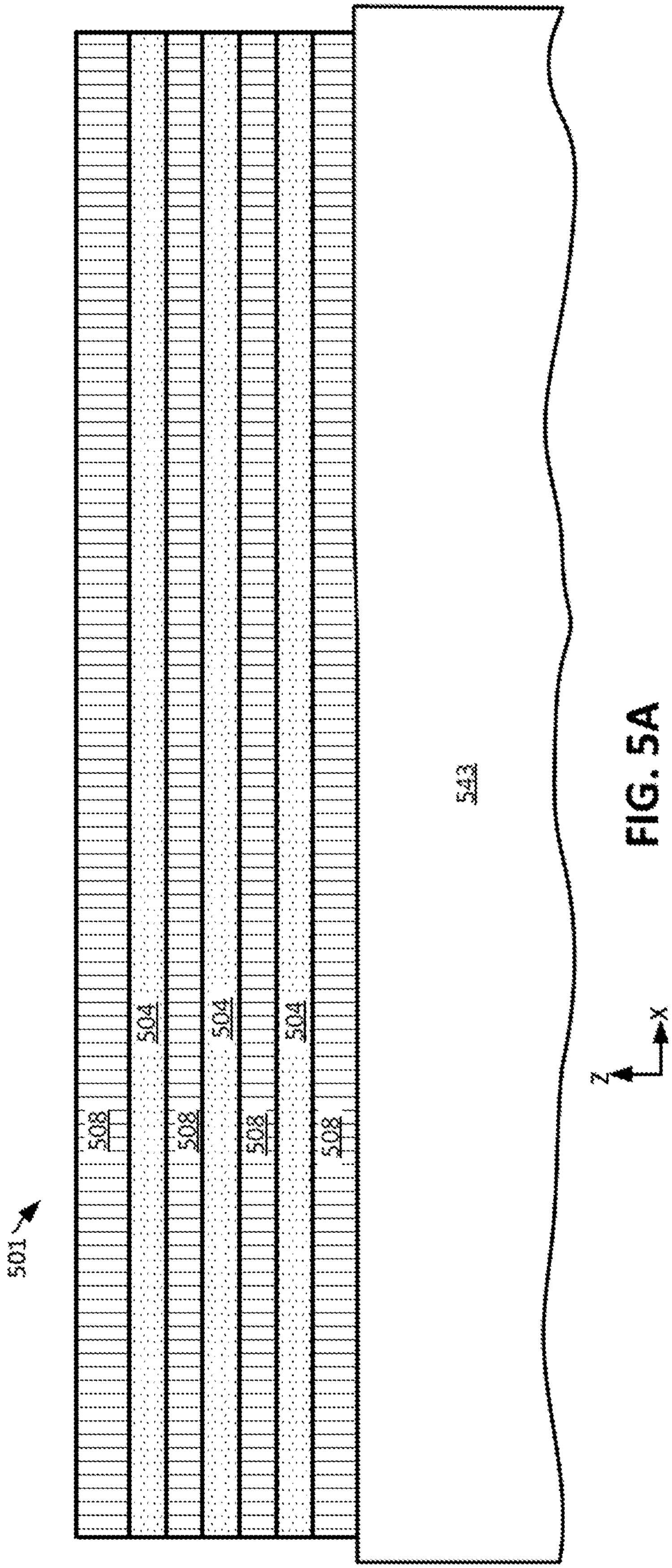
Figure 5B:
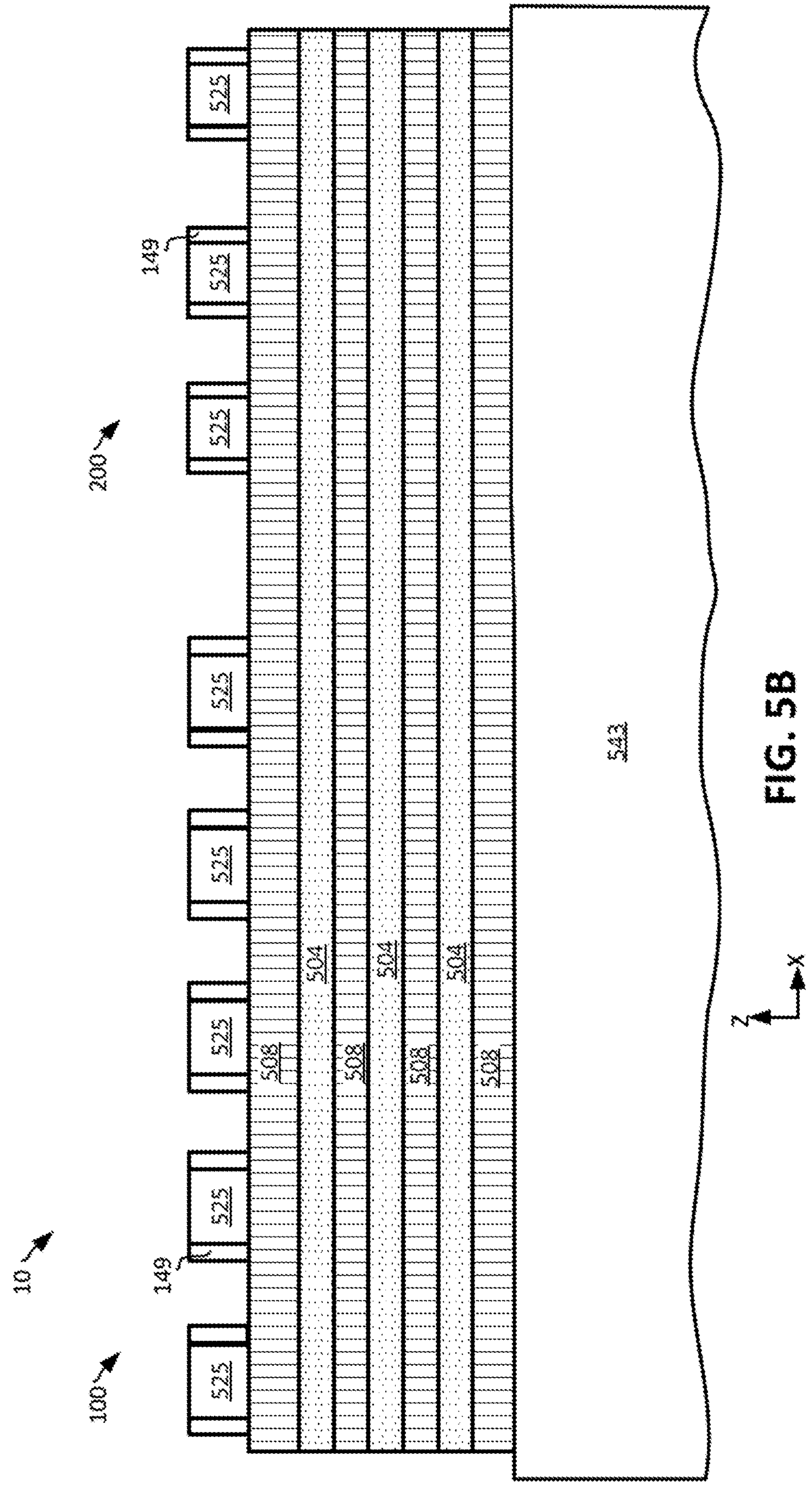

In an example, the formation of the ESD protection device and the logic device may share many common or same processes. For example, when forming the ESD protection device and the laterally adjacent logic device, a fin structure of alternating layers of channel material and sacrificial semiconductor material is formed (e.g., see FIG. 5A), where the ESD protection device is to be formed in one portion of the fin structure and the logic device is to be formed in another portion of the fin structure. Dummy or sacrificial gates are formed on the fin structure, e.g., in positions over the channel region where the final gates are to be eventually formed (e.g., see FIG. 5B). Diffusion region trenches are formed to sides of the dummy gates, e.g., see FIG. 5C, using a trench etch process. In an example, the diffusion region trenches extend within the sub-fin by the above discussed distance d2, see FIG. 5C.

Figure 5C:
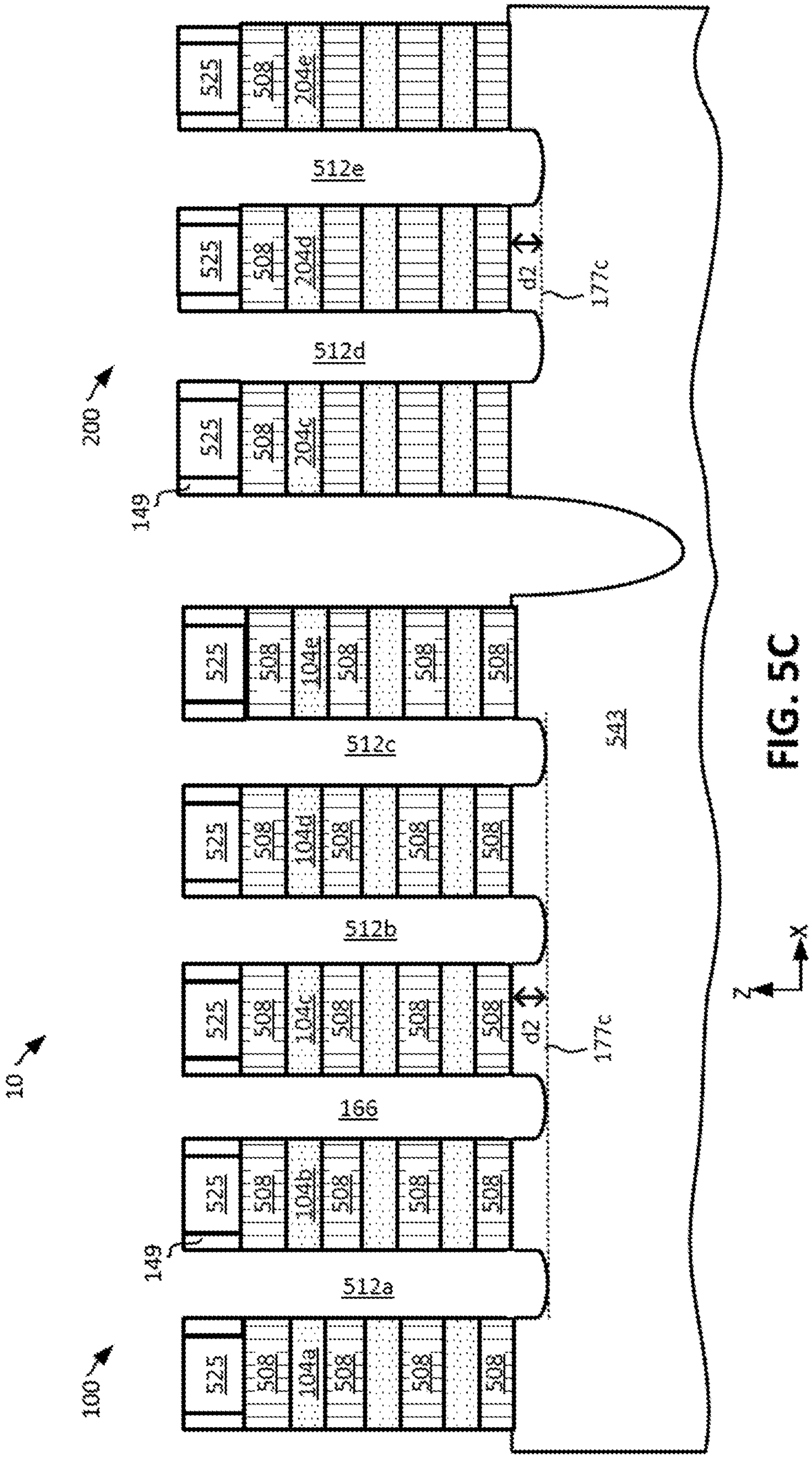

In an example, an additional trench deepening process is carried out for the ESD protection device, e.g., to deepen the diffusion region trenches of the ESD protection device only, without carrying out such a trench deepening process for the logic device (e.g., see FIG. 5C1). For example, the diffusion region trenches of the logic device may be masked by a hard mask, while the diffusion region trenches of the ESD protection device are being deepened. Accordingly, after the trench deepening process, the diffusion region trenches of the ESD protection device now extend deeper within the corresponding sub-fin, e.g., by a depth of d1, see FIG. 5C1. Note that the diffusion region trenches of the logic device continue to extend within the corresponding sub-fin by the distance d2.

Subsequently, the ESD protection device and the logic device are processed to form inner gate spacers for the two devices, and to form the diffusion regions within the corresponding diffusion region trenches, e.g., see FIG. 5D. Subsequently, the dummy gates are removed for both the ESD protection device and the logic device, and the nanoribbons of the two devices are released by removing the sacrificial material from the multilayer fin structure, e.g., see FIG. 5E. Final gate structures are then formed for the two devices, and diffusion region contacts and gate contacts are formed, e.g., see FIG. 5F.

In an example, the above discussed processes are performed from the frontside of the chip. Subsequently, the resultant structure may be processed from the backside (e.g., by flipping the structure and processing from the top). For example, the underlying substrate of both the devices may be removed or otherwise planarized (e.g., see FIG. 5G) to expose the backside of sub-fin, and the sub-fin of the logic device may be at least in part etched (e.g., see FIG. 5H), e.g., to make room for backside interconnect features for backside power and/or signal routing. Note that while the sub-fin for the logic device is being etched, the sub-fin for the ESD protection device may not be etched (or etched at a lower rate). Accordingly, the sub-fin of the ESD protection device has a greater thickness or vertical height than the sub-fin of the logic device.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the material has an element that is not in the other material.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For example, in some embodiments, such tools may be used to detect a first device laterally adjacent to a second device, where first one or more diffusion regions of the first device extend within a corresponding sub-fin by a first depth, where second one or more diffusion regions of the second device extend within a corresponding sub-fin by a second depth, and where the second depth is greater than the first depth by at least at least 2 nm, or at least 4 nm, or at least 6 nm, or at least 8 nm, or at least 10 nm, or at least 15 nm, or at least 20 nm, or at least 25 nm. In an example, each of the first one or more diffusion regions of the first device has a lower section that is below a lower surface of a gate structure of the first device, where the lower section of the first one or more diffusion regions have a first vertical height; and each of the second one or more diffusion regions of the second device has a lower section that is below a lower surface of a gate structure of the second device, where the lower section of the second one or more diffusion regions have a second vertical height; and where the first vertical height is greater than the second vertical height by at least 2 nm, or at least 4 nm, or at least 6 nm, or at least 8 nm, or at least 10 nm, or at least 15 nm, or at least 20 nm, or at least 25 nm. Numerous configurations and variations will be apparent in light of this disclosure.

Architecture

Figure 1B:
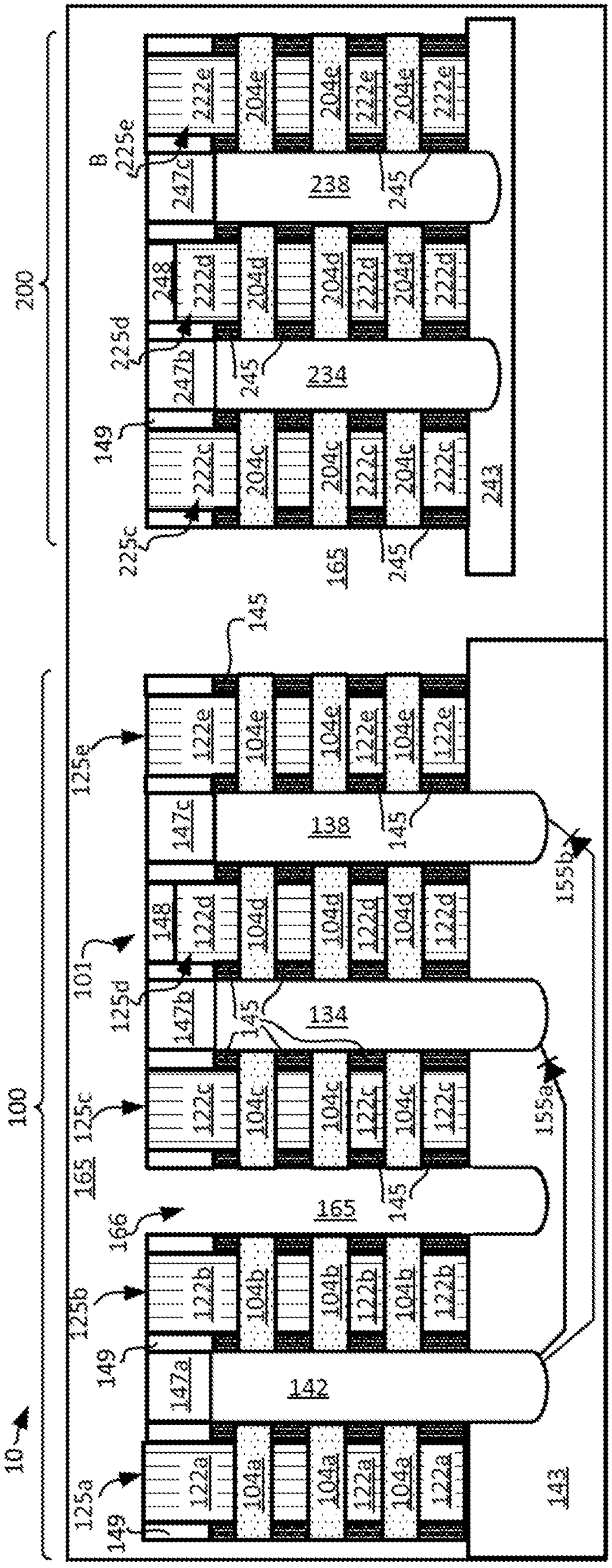
FIG. 1B schematically illustrates parasitic diodes formed within the first device of the integrated circuit of FIG. 1A, in accordance with an embodiment of the present disclosure.

FIG. 1A illustrates a cross-sectional view of a portion of an integrated circuit 10 comprising (i) a first device 100 that is usable for ESD protection of the integrated circuit 10, and (ii) a second device 200 laterally adjacent to the first device, where the first device 100 comprises a first plurality of diffusion regions 142, 134, 138 in contact with a sub-fin 143, where the first device 100 uses the sub-fin 143 for current conduction and for ESD protection of the integrated circuit 10, where the second device 200 comprises a second plurality of diffusion regions 234, 238 in contact with a component 243 that is at a bottom section of the second device 200, where one or more (e.g., all) of the first plurality of diffusion regions 142, 134, 138 of the first device 100 extend to a distance d1 below a lower surface of one or more gate structures 125 of the first device 100, where one or more (e.g., all) of the second plurality of diffusion regions 234, 238 of the second device 200 extend to a distance d2 below a lower surface of one or more gate structures 225 of the second device 200, and where the distance d1 is at least 1 nm (or at least 2 nm) greater than the distance d2, in accordance with an embodiment of the present disclosure. FIG. 1B illustrates parasitic diodes formed within the first device 100 of the integrated circuit 10 of FIG. 1A, in accordance with an embodiment of the present disclosure.

Thus, FIG. 1A illustrates an example of an ESD protection device 100, in which the diffusion regions 142, 134, 138 extend within the sub-fin 143 to the distance d1, e.g., which is a depth or height of sections of each diffusion region extending within the sub-fin 143, and where at least a part of the current is conducted through the sub-fin 143. For example, during an ESD event, current is conducted to and/or from the sub-fin 143, through one or more of the diffusion regions 142, 134, 138. Accordingly, the diffusion regions 142, 134, 138 extend deeply (e.g., up to the relatively greater depth of d1, compared to the depth d2) within the sub-fin 143, to form relatively better contact between individual ones of the diffusion regions 142, 134, 138 and the sub-fin 143. For example, as will be discussed herein in turn, during formation of the device 100, diffusion trenches (e.g., see FIGS. 5C1, 5C2) for eventual formation of the diffusion regions 142, 134, 138 are made deeper within the sub-fin (e.g., to the depth d1). Accordingly, when the diffusion regions are formed (e.g., epitaxially grown, see FIG. 5D), there is relatively more semiconductor (e.g., comprising silicon) sub-fin to promote better epitaxial growth of the various diffusion regions, leading to a more robust contact between individual diffusion region 142, 134, 138 and the sub-fin 143 that can handle relatively more current and achieve a relatively lower resistance.

In contrast, in an example, the device 200 comprises a sub-fin 243 (although the sub-fin 243 maybe absent in another example), although the sub-fin 243 may not conduct any significant amount of current. Accordingly, the diffusion regions 234, 238 need not make good contact with the sub-fin 243, and hence, the diffusion regions 234, 238 extend to a relatively shallow depth of d2 (e.g., compared to d2) within the sub-fin 243. For example, the extension of the diffusion regions 234, 238 within the sub-fin 243 by distance d2 may be simply due to unintentional (or intentional) byproduct of the etching process for formation of trenches (e.g., see trenches 512*d*, 512*e* of FIG. 5C) in which the diffusion regions 234, 238 are to be eventually formed.

Note that the specific device 100 of FIG. 1A is used herein as an example of an ESD protection device and/or a device that uses sub-fin for current conduction, and in other examples the device 100 may be replaced by another appropriate ESD protection device (and/or any other device that uses sub-fin for current conduction) in which corresponding diffusion regions extend within the sub-fin 143 to a distance d1. For example, the device 100 is a transistor device that has an integrated diode, where the integrated transistor-diode device 100 is used for ESD protection. However, in another example, another appropriate device (such as a diode or a transistor) can replace the device 100, as long as the replacement device uses sub-fin for current conduction (such as ESD protection devices) and has diffusion region(s) extending within corresponding sub-fin in the manner discussed herein.

As can be seen, the cross-sectional view of FIG. 1A is taken parallel to, and through, the channel regions, such that the channel regions 104 and 204 of the devices 100 and 200, respectively, and epitaxially formed diffusion regions 134, 138, 142, 234, 238 are shown. FIG. 1A also includes another cross-sectional view 170 of the device 100, where the cross-sectional view 170 is along line A-A' of the device 100 of FIG. 1A, where the cross-sectional view 170 illustrates one stack of channel regions 104 and a gate electrode 122. For example, cross-sectional view 170 illustrates a cross-sectional view of the channel regions 104 comprising nanoribbons, nanowires, or nanosheets, for example.

Referring now to the device 100 of the integrated circuit 10, in an example, the diffusion region 134 may be configured to act as a drain region, the diffusion region 138 may be configured to act as a source region, and the diffusion region 142 may be configured to act as a tap or body region for coupling the sub-fin 143 to a ground (or Vcc) terminal. In an example, the source, drain, and the tap diffusion regions (e.g., the diffusion regions 138, 134, 142, respectively) may have similar shape, and may be formed using source and drain formation processes of a transistor. In an example, the device 100 comprises a transistor structure 101 comprising the source diffusion region 138 and the drain diffusion region 134, and the tap or body diffusion region 142 contacting the sub-fin 143. Furthermore, although a single transistor 101 having a single source region 138 and a single drain region 134, along with a single tap diffusion region 142 is illustrated in the example of FIG. 1A, some other examples may include more of each of these regions.

The device 100 includes a plurality of stack of channel regions 104, such as a stack of channel regions 104*a*, a stack of channel regions 104*b*, a stack of channel regions 104*c*, a stack of channel regions 104*d*, and a stack of channel regions 104*e*, and a corresponding plurality of gate structures 125*a*, 125*b*, 125*c*, 125*d*, and 125*e*, respectively. In an example, individual channel regions 104 are wrapped around by a corresponding gate structure 125.

In the example of FIG. 1A, the device 100 is a GAA device in which the gate structure 125 wraps around individual channel regions 104. In an example, individual channel regions 104 are nanoribbons. As will be further appreciated in light of this disclosure, reference to nanoribbons is also intended to include other channel regions, such as nanowires or nanosheets, and other such semiconductor bodies around which a gate structure at least in part wraps around the channel region. To this end, the use of a specific channel region configuration (e.g., GAA) is not intended to limit the present description to that specific channel configuration. In an example, the teachings of this disclosure may also be applicable to devices in which the gate at least partially wrap around the channel region, such as finFET structures having a fin as a channel region. Thus, a stack of nanoribbon channel regions 104*a* may be replaced by a corresponding fin, in one example. Similarly, a stack of nanoribbon channel regions 104*a* may be replaced by a corresponding stack of nanowires or nanosheets, in another example.

In one embodiment, the device 100 is formed on a sub-fin 143. In the example of FIG. 1A, the transistor 101 comprises the diffusion regions 134, 138, the nanoribbons 104*d* laterally extending from the diffusion region 134 to the diffusion region 138, and the gate structure 125*d* wrapping around the nanoribbons 104*d*. In an example, the transistor 101 is an NMOS transistor 101, and accordingly, the sub-fin 143 is doped with a p-type dopant. Example p-type dopants include boron, gallium, indium, and aluminum. However, in another example, the transistor 101 may be a PMOS transistor, and the sub-fin 143 may be doped with an n-type dopant. Example n-type dopants include phosphorous and arsenic. In an example, the sub-fin 143 may have an appropriate doping concentration, such as in the range of 1E11 to 1E24. Note that the sub-fin 143 is below the corresponding nanoribbons 104, and may not be present in locations above which the nanoribbons 104 are not present, as illustrated in the cross-sectional view 170 of FIG. 1A.

As illustrated in FIG. 1A, in an example, the device 100 comprises a plurality of stacks of nanoribbons 104, such as stacks of nanoribbons 104*a*, 104*b*, 104*c*, 104*d*, 104*e*. In the example of FIG. 1A, each vertical stack of nanoribbons 104 comprises three nanoribbons. The number of nanoribbons 104 in each vertical stack of nanoribbon (i.e., three nanoribbons per stack) is merely an example, and each vertical stack of nanoribbons may comprise a different number of nanoribbons, such as one, two, four, five or higher number of nanoribbons.

As illustrated, the vertical stack of nanoribbons 104*a* extends from the diffusion region 142 away from the transistor 101, and the vertical stack of nanoribbons 104*b* extends from the diffusion region 142 towards the transistor 101. Note that while one end of individual nanoribbons of the stacks 104*a*, 104*b* is in contact with the diffusion region 142, another end of individual nanoribbons of the stacks 104*a*, 104*b* is in contact with dielectric material 165. The dielectric material 165 may be above various components of the device 100, as illustrated.

As also illustrated, the nanoribbons 104*c* extend from the diffusion region 134 and away from the diffusion region 138 (e.g., towards the diffusion region 142). The nanoribbons 104*e* extend from the diffusion region 138 and away from the diffusion regions 134 and 142. Thus, while one end of individual nanoribbons 104*c* is in contact with the diffusion region 134, another end of individual nanoribbons 104*c* is in contact with dielectric material 165. Similarly, while one end of individual nanoribbons 104*e* is in contact with the diffusion region 138, another end of individual nanoribbons 104*e* is in contact with dielectric material 165.

In one embodiment, the nanoribbons 104*d* extend from the diffusion region 134 to the diffusion region 138. For example, one end of individual nanoribbons 104*d* is in contact with the diffusion region 134, another end of individual nanoribbons 104*d* is in contact with the diffusion region 138.

Note that each of the nanoribbons 104*a*, 104*b*, 104*c*, and 104*e* has one end in contact with the dielectric material 165. Thus, the nanoribbons 104*a*, 104*b*, 104*c*, and 104*e* may act as "dummy" channel region, in that the nanoribbons 104*a*, 104*b*, 104*c*, and 104*e* may not conduct current between a source and a drain region, and may not act as active channel region of the transistor 101. In contrast, the nanoribbons 104*d* extending from the diffusion region 134 to the diffusion region 138 selectively conducts current (e.g., based on the voltages applied to various terminals of the transistor 101), and hence, form the active channel regions of the transistor 101.

Although the nanoribbons 104*a*, 104*b*, 104*c*, and 104*e* may not provide much useful functionality to the device 100, the nanoribbons 104*a*, 104*b*, 104*c*, and 104*e* are formed as a standard process of forming nanoribbons within a section of a die comprising the devices 100 and 200. For example, the nanoribbons 104*a* and 104*b*, along with corresponding sacrificial material and dummy gate stack define a diffusion region trench therebetween (e.g., trench 512*a*, see FIGS. 5C-5C2) where the diffusion region 142 is eventually formed, thereby facilitating formation of the diffusion region 142.

The nanoribbons 104 may comprise any appropriate semiconductor material, such as group IV material (e.g., silicon, germanium, or SiGe) or group III-V materials (e.g., indium gallium arsenide). In other embodiments, the nanoribbons 104 may be replaced by fins on which the corresponding gate structures are formed to provide double-gate or tri-gate configurations (as opposed to gate-all-around configurations with nanoribbons or wires). The nanoribbons 104 may be doped. For example, nanoribbons 104*c*, 104*d*, 104*e* may have the same type of doping as the diffusion regions 134, 138, and nanoribbons 104*a*, 104*b* may have the same type of doping as the diffusion region 142. In other examples, the nanoribbons 104 may be partially doped (e.g., such as the example case where a nanoribbon is doped at its ends but not in the middle portion), or undoped, and may be shaped or sculpted during the gate formation process, according to some embodiments. In some cases, the nanoribbons 104 may be a multilayer structure, such as a SiGe body cladded with germanium, or a silicon body cladded with SiGe. Any number of channel configurations can be used.

According to some embodiments, the diffusion regions 134, 138, 142 are epitaxial regions that are provided using an etch-and-replace process. In other embodiments one or more of the diffusion regions could be, for example, implantation-doped native portions of the semiconductor fins or substrate. Any semiconductor materials suitable for source and drain regions can be used (e.g., group IV and group III-V semiconductor materials). The diffusion regions may include multiple layers such as liners and capping layers to improve contact resistance. In any such cases, the composition and doping of the diffusion regions, including the source diffusion region 138, the drain diffusion region 134, and the tap diffusion region 142, may be the same or different, depending on the polarity of the transistors, as will be discussed in further detail herein below. Any semiconductor materials suitable for source and drain regions can be used (e.g., group IV and group III-V semiconductor materials).

Referring again to FIG. 1A, in some embodiments, conductive contacts are formed over various regions of the device 100. For example, conductive contacts 147*a*, 147*b*, 147*c* are respectively formed on the diffusion regions 142, 134, and 138, respectively; and conductive gate contact 148 is formed over the gate structure 125*d*. The conductive contacts may be any suitably conductive material, such as one or more metals and/or alloys thereof. In some embodiments, conductive contacts include one or more of the same metal materials as gate electrode, or a different conductive material.

Note that in an example, the gate structures 125*a*, 125*b*, 125*c*, and/or 125*e* are not contacted. Thus, there are no corresponding gate contacts for these gate structures. In an example, the gate structures 125*a*, 125*b*, 125*c*, and/or 125*e* are dummy gate structures and are electrically floating, and do not impart any meaningful functionality in the device 100. In an example, the gate structures 125*a*, 125*b*, 125*c*, and/or 125*e* are present in the device 100, e.g., because gate structures are formed with regular pitch or interval within at least a section of a die that includes the structure, and the gate structures 125*a*, 125*b*, 125*c*, and/or 125*e* are formed as a part of gate structure formation processes for multiple devices within a section of the chip that includes the devices 100, 200.

The gate structure 125*a* contacts and wraps around individual nanoribbons 104*a*, the gate structure 125*b* contacts and wraps around individual nanoribbons 104*b*, the gate structure 125*c* contacts and wraps around individual nanoribbons 104*c*, the gate structure 125*d* contacts and wraps around individual nanoribbons 104*d*, and the gate structure 125*e* contacts and wraps around individual nanoribbons 104*e*. Note that in another example where the device 100 includes a fin instead of a stack of nanoribbons, the corresponding gate structure is on and partly wraps around (e.g., is on three sides) the fin.

In one embodiment, each gate structure 125 includes a gate dielectric 123 that wraps around middle portions of each nanoribbon, and a gate electrode 122 that wraps around the gate dielectric 123. The gate dielectric 123 is illustrated in an expanded view of a section 119 of the device 100. As illustrated, the gate electrode 122*a* of the gate structure 125*a* wraps around middle portions of individual nanoribbons 104*a*, the gate electrode 122*b* of the gate structure 125*b* wraps around middle portions of individual nanoribbons 104*b*, the gate electrode 122*c* of the gate structure 125*c* wraps around middle portions of individual nanoribbons 104*c*, and so on. Note that the middle portion of each nanoribbon 104 is between a corresponding first end portion and a second end portion, where the first end portions of the nanoribbons of a stack is wrapped around by corresponding first inner gate spacer 145, and where the second end portions of the nanoribbons of a stack is wrapped around by corresponding second inner gate spacer 145.

In some embodiments, the gate dielectric 123 may include a single material layer or multiple stacked material layers. The gate dielectric 123 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. The high-k dielectric material (e.g., hafnium oxide) may be doped with an element to affect the threshold voltage of the given semiconductor device. According to some embodiments, the doping element used in gate dielectric 123 is lanthanum. In some embodiments, the gate dielectric can be annealed to improve its quality when high-k dielectric material is used. In some embodiments, the gate dielectric 123 includes a first layer (e.g., native oxide of nanoribbons, such as silicon dioxide or germanium oxide or SiGe-oxide) on the nanoribbons, and a second layer of high-k dielectric (e.g., hafnium oxide) on the first layer. The gate dielectric 123 is present around middle portions of each nanoribbon, and although not illustrated, may also be present over sub-fin 143, and/or on inner sidewalls of the inner gate spacers 145.

In one embodiment, one or more work function materials (not illustrated in FIG. 1A) may be included around the nanoribbons 104. Note that work function materials are called out separately, but may be considered to be part of the gate electrodes. In this manner, a gate electrode 122 may include multiple layers or components, including one or more work function materials, gate fill material, capping or resistance-reducing material, to name a few examples. In some embodiments, a p-channel device may include a work function metal having titanium, and an n-channel device may include a work function metal having tungsten or aluminum, although other material and combination may also be possible. In some other embodiments, the work function metal may be absent around one or more nanoribbons. In still other embodiments, there may be insufficient room for any gate fill material, after deposition of work function material (i.e., a given gate electrode may be all work function material and no fill material). In an example, the gate electrodes 122 may include any sufficiently conductive material, such as a metal, metal alloy, or doped polysilicon. The gate electrodes may include a wide range of materials, such as polysilicon or various suitable metals or metal alloys, such as aluminum, tungsten, titanium, tantalum, copper, cobalt, molybdenum, titanium nitride, or tantalum nitride, for example. Numerous gate structure configurations can be used along with the techniques provided herein, and the present disclosure is not intended to be limited to any particular such configurations.

Each gate structure 125 also includes two corresponding inner gate spacers 145 that extend along the sides of the gate electrode 122, to isolate the gate electrode 122 from an adjacent diffusion region (or from the dielectric material 165, e.g., for the right end of nanoribbons 104*b* or 104*e*). The inner gate spacers 145 at least partially surround the end portions of individual nanoribbons. In one embodiment, gate spacers 145 may include a dielectric material, such as silicon nitride, for example.

As discussed herein above, the gate structures 125*a*, 125*b*, 125*c*, and/or 125*e* are inactive gates, e.g., are electrically floating, whereas the gate structure 125*d* is coupled to an external circuit through the gate contact 148. In an example, the inactive gate structures (e.g., gate structure 124*c*) do not impart any meaningful control over the corresponding dummy nanoribbons (e.g., nanoribbon 104*c*). For example, one end of the dummy nanoribbons 104*c* are in contact with the drain diffusion region 134, while the other end of the nanoribbons 104*c* are not coupled to any source or drain region. Accordingly, the nanoribbons 104*c* do not conduct any current and are dummy nanoribbons, for example, as also discussed herein above.

As illustrated, each diffusion region 142, 134, and 138 in part extend within the sub-fin 143. Extension of the diffusion regions within the sub-fin results in a better contact between the sub-fin and the diffusion regions. Although the source diffusion region 138 and the drain diffusion region 134 need not contact the sub-fin 143 during regular operation of the transistor 101, such better contact between a diffusion region and the sub-fin 143 may come into play during operation of the diode 155*a* (see FIG. 2 discussed below), e.g., during an ESD event.

In an example, a trench 166 comprising the dielectric material 165 is laterally between the diffusion regions 142 and 134 (e.g., laterally between, and in contact with, respective ends of the nanoribbons 104*b* and 104*c*). In an example, the trench 166 comprising dielectric material 165 may also in part extend within the sub-fin 143. For example, trenches for formation of the various diffusion regions 142, 134, 138 and the trench 166 are formed using one or more same diffusion trench etching process, and hence, the trench 166 may also extend within the sub-fin 143 by the distance or depth d1 (e.g., see FIG. 5C1).

Referring again to FIG. 1A, the devices 100 and 200 are laterally adjacent to each other. For example, the devices 100 and 200 may be within a same area or section of the integrated circuit chip, and laterally separated from each other by at most 100 nm, or at most 200 nm, or at most 400 nm, or at most 1000 nm, or at most 1200 nm, for example.

The device 200 comprises diffusion regions 234 and 238, one of which may be a source region and the other of which may be a drain region of the transistor device 200. Gate stacks 225*c*, 225*d*, 225*e* are adjacent to the diffusion regions 234, 238, where each gate stack 225 comprises corresponding gate electrode 222 and gate dielectric (not illustrated). Also illustrated are the stacks of nanoribbons 204*c*, 204*d*, 204*e*. The transistor device 200 will be apparent, based on the discussion with respect to the device 100.

Note that the device 100 is formed on a sub-fin 143. The device 200 is formed on a component 243, where the component 234 may be a sub-fin, a substrate, or dielectric material. Also, in case the component 243 is a sub-fin, a vertical height h1 of the sub-fin 143 is greater than a vertical height h2 of the sub-fin 243, e.g., by at least 2 nm, or at least 4 nm, or at least 6 nm, or at least 10 nm, or at least 15 nm, or at least 20 nm, or at least 25 nm, for example.

Furthermore, the tap diffusion region 142 of the device 100 is in contact with the sub-fin 143, resulting in the formation of the parasitic diode 155*a* (see FIG. 1B) based on the PN junction between the sub-fin 143 and the diffusion region 134. In contrast, there is no such tap diffusion region in the device 200. Accordingly, unlike the diode 155*a* within the device 100, no parasitic diode may be formed for the device 200.

In an example, as schematically illustrated using imaginary dotted line 177*a* in FIG. 1A, lower surfaces of the gate structures 125 and 225 of the devices 100 and 200, respectively, may be substantially coplanar (e.g., a vertical separation of at most 1 nm or 2 nm). For example, a lower surface of a gate structure 125 of the device 100 may be at least in part on a first horizontal plane, and a lower surface of a gate structure 225 of the device 200 may be at least in part on a second horizontal plane, where the first horizontal plane overlaps with the second horizontal plane, or is vertically separated from the second horizontal plane by at most 1 nm, or at most 2 nm. Similarly, as also schematically illustrated using the imaginary dotted line 177*a*, upper surfaces of the sub-fins 143, 243 of the devices 100 and 200, respectively, may be substantially coplanar (e.g., a vertical separation of at most 1 nm or 2 nm). Similarly, in an example, a lower surface of the lowest nanoribbon 104 of each stack of the device 100 may be coplanar with a lower surface of the lowest nanoribbon 204 of each stack of the device 200 (e.g., a vertical separation of at most 1 nm or 2 nm).

As mentioned above, in an example, the diffusion regions 142, 134, 138 and/or the trench 166 extend within the sub-fin 143 to a distance d1, e.g., which is a depth or height of sections of each diffusion region of the device 100 (and the trench 166) extending within the sub-fin 143. For example, each of the diffusion regions 142, 134, 138 and/or the trench 166 has a corresponding lower section that is below lower surfaces of one or more gates 125, where a vertical height of such lower sections of the diffusion regions 142, 134, 138 and the trench 166 is substantially d1 (e.g., within 1 nm or 2 nm of d1). For example, during an ESD event, current is conducted to and/or from the sub-fin 143, through one or more of the diffusion regions 142, 134, 138. Accordingly, the diffusion regions 142, 134, 138 extend deeply (e.g., up to the depth of d1) within the sub-fin 143, to form relatively better contact between individual ones of the diffusion regions 142, 134, 138 and the sub-fin 143.

For example, during formation of the device 100, diffusion trenches (e.g., see FIGS. 5C1, 5C2) for eventual formation of the diffusion regions 142, 134, 138 are made deeper within the sub-fin (e.g., to the depth d1). Accordingly, when the diffusion regions 142, 134, 138 are formed (e.g., epitaxially grown, see FIG. 5D), there is relatively more semiconductor (e.g., comprising silicon) sub-fin to promote better epitaxial growth of the various diffusion regions of the device 100, leading to a more robust contact between individual diffusion region 142, 134, 138 and the sub-fin 143 that can handle relatively more current and achieve a relatively lower resistance.

In contrast, in an example, the device 200 comprises a sub-fin 243 (although as discussed above, the sub-fin 243 may be replaced by a substrate or dielectric material), and the sub-fin 243 may not conduct any significant amount of current. Accordingly, the diffusion regions 234, 238 of the device 200 need not make good contact with the sub-fin 243, and hence, the diffusion regions 234, 238 extend to a shallow depth of d2 within the sub-fin 243. For example, each of the diffusion regions 234 and/or 238 has a corresponding lower section that is below lower surfaces of one or more gates 225, where a vertical height of such lower sections of the diffusion regions 234 and/or 238 is d2. In an example, the extension of the diffusion regions 234, 238 within the sub-fin 243 by distance d2 may be simply due to unintentional (or intentional) byproduct of the etching process for formation of trenches (e.g., see trenches 512*d*, 512*e* of FIG. 5C) in which the diffusion regions 234, 238 are to be eventually formed.

As illustrated in FIG. 1A, d1 is greater than d2. For example, d1 is greater than d2 by at least 2 nm, or at least 4 nm, or at least 6 nm, or at least 8 nm, or at least 10 nm, or at least 15 nm, or at least 20 nm, or at least 25 nm.

In an example, a lower surface of one or more (e.g., each) of the diffusion regions 142, 134, 138, and/or the trench 166 of the device 100 may be at least in part on a first horizontal plane (represented schematically using imaginary dotted line 177*b* in FIG. 1A), and lower surfaces of the diffusion regions 234 and/or 238 of the device 200 may be at least in part on a second horizontal plane (represented schematically using imaginary dotted line 177*c* in FIG. 1A), where the first horizontal plane is lower than the second horizontal plane by at least 2 nm, or at least 4 nm, or at least 6 nm, or at least 8 nm, or at least 10 nm, or at least 15 nm, or at least 20 nm, or at least 25 nm.

Figure 3:
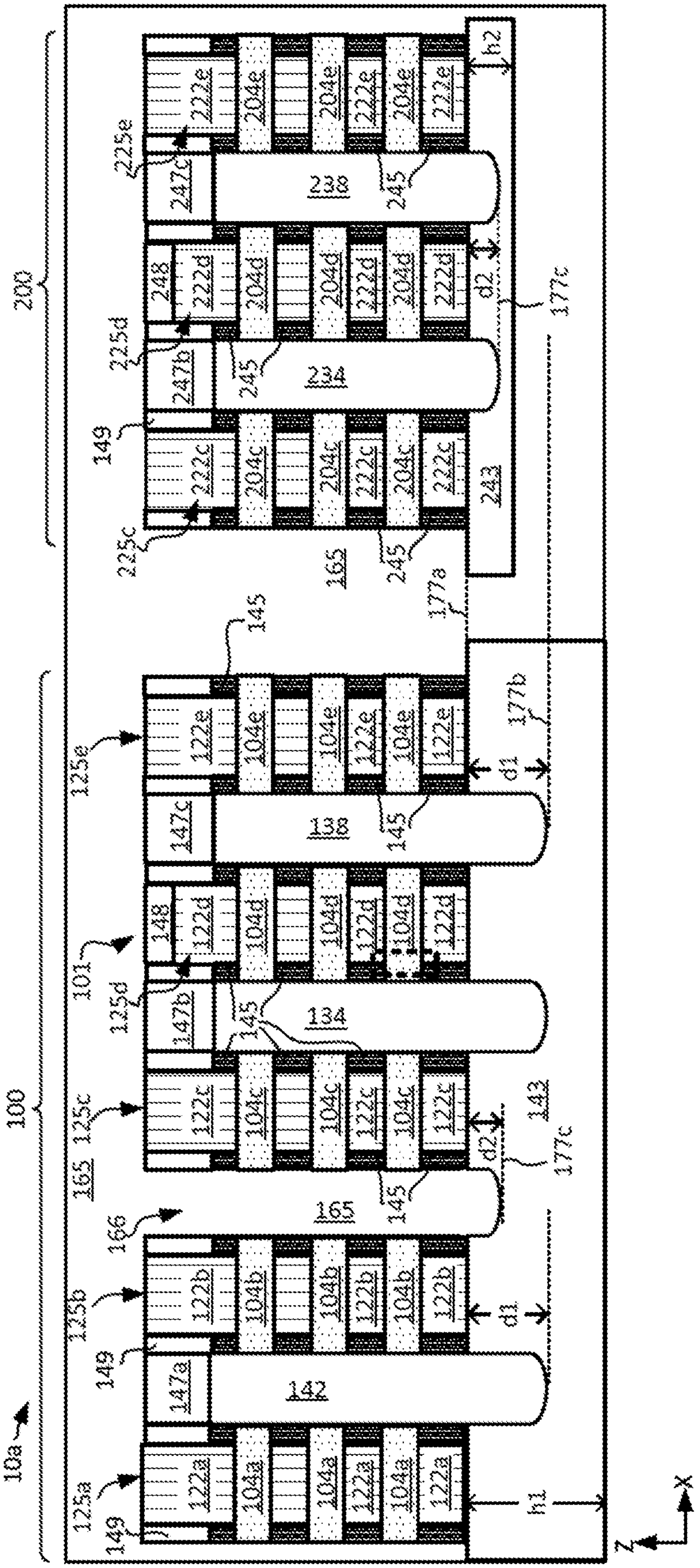
FIG. 3 illustrates a cross-sectional view of a portion of another integrated circuit that is at least in part similar to the integrated circuit of FIG. 1A, wherein a trench of the first device of FIG. 3 is shallower than a corresponding trench of the device of FIG. 1A, in accordance with an embodiment of the present disclosure.

Note that in the example of FIG. 1A, lower surfaces of the diffusion regions 142, 134, 138, and the trench 165 of the device 100 are shown to be in the horizontal plane 177*b*. In contrast, FIG. 3 illustrates a cross-sectional view of a portion of another integrated circuit 10*a* that is at least in part similar to the integrated circuit 10 of FIG. 1A, wherein a trench 166*a* of the first device 100 of FIG. 3 (e.g., where the trench 166*a* includes dielectric material 165) is shallower than a corresponding trench 166 of the device 10 of FIG. 1A, in accordance with an embodiment of the present disclosure. Similar components in FIGS. 1A and 3 are illustrated using same labels. As illustrated in FIG. 3, the lower surface of the trench 166*a* of the device 100 is at least in part on the horizontal plane 177*c*. Note that as discussed above, the lower surfaces of the diffusion regions 234 and/or 238 of the device 200 may be at least in part also on the horizontal plane 177*c*. In an example, in FIG. 3 and unlike FIG. 1A, the trench 166*a* has a corresponding lower section that is below lower surfaces of one or more gates 125, where a vertical height of such lower sections of the trench 166*a* is substantially d2 (e.g., within 1 nm or 2 nm of d2).

Figure 2:
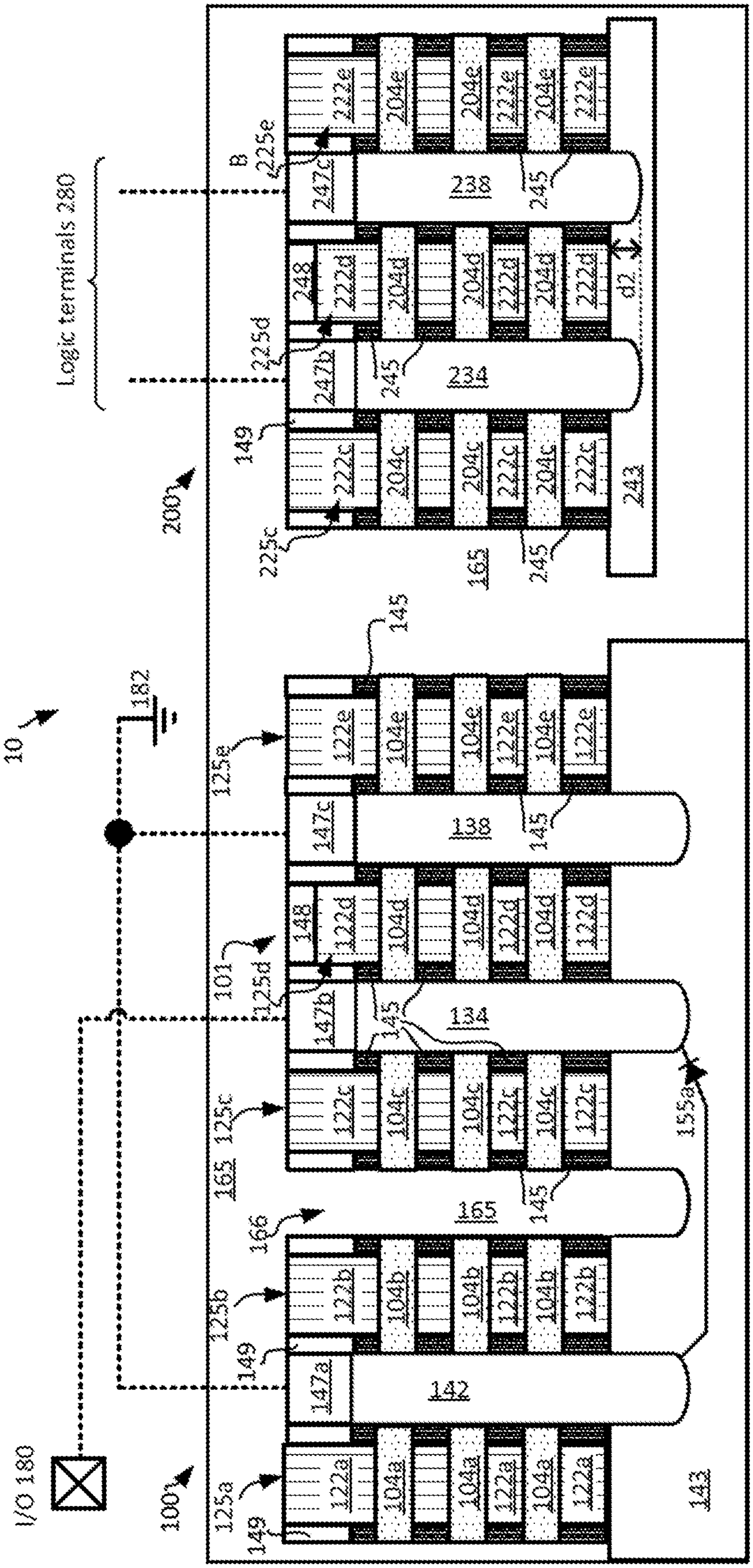
FIG. 2 schematically illustrates example connections of various contacts of the first and second devices of FIG. 1A, in accordance with an embodiment of the present disclosure.

In an example, individual diffusion regions are formed within corresponding diffusion region trenches (e.g., diffusion region 142 is formed within trench 512*a* of FIG. 5C1 or 5C2). In an example, a bottom surface of the diffusion region 142 is substantially in contact with a bottom surface of the trench 512*a*. In an example, there may be a gap 154 between the bottom surface of the diffusion region 142 and the bottom surface of the trench 512*a*, as illustrated in an expanded view 120 of FIG. 1A. This gap 154 may be a void (e.g., empty), or filled with remnants of the etch process to etch the trench 512*a*. In an example, the gap 154 may not exist. In an example, due to the deepening and broadening of the trench 512*a* (e.g., discussed with respect to FIGS. 5C1 and 5C2), there may be better epitaxial growth of the diffusion region 142 extending within the sub-fin 143, and hence, the gap 154 may be relatively less or almost non-existential, thereby leading to better diffusion region to sub-fin electrical contact.

Referring again to FIG. 1A, in an example, the transistor 101 is an NMOS transistor, in which the source and drain regions 138, 134, respectively, are doped with n-type dopant, the tap region 142 is doped with p-type dopant, and the sub-fin 143 is doped with p-type dopant. Note that in another example, the transistor 101 can be a PMOS, in which the case the type of dopants of the diffusion regions and the sub-fin 143 would be reversed.

Thus, the diffusion region 142 and the sub-fin 143 are doped with the same type of dopant. For example, both the diffusion region 142 and the sub-fin 143 are doped with p-type dopant, if the transistor 101 is an NMOS; and both the diffusion region 142 and the sub-fin 143 are doped with n-type dopant, if the transistor 101 is a PMOS. In contrast, the diffusion regions 138, 134 (e.g., source and drain regions) are doped with dopant type that is opposite of the dopant type of the diffusion region 142 and the sub-fin 143. Accordingly, a diode 155*a* may be formed based on the PN junction between the sub-fin 143 and the diffusion region 134, and another diode 155*b* may be formed based on the PN junction between the sub-fin 143 and the diffusion region 138, as illustrated in FIG. 1B.

For example, assuming the transistor 101 is an NMOS, for the diode 155*a*, the diffusion region 142 and the sub-fin 143 form the anode, the diffusion region 134 forms the cathode, a contact 147*a* of the diffusion region 142 forms a terminal of the anode, and a contact 147*b* of the diffusion region 134 forms a terminal of the cathode. Note that if the transistor 101 is a PMOS, the anode and cathodes would be reversed.

Similarly, assuming the transistor 101 is an NMOS, for the diode 155*b*, the diffusion region 142 and the sub-fin 143 form the anode, the diffusion region 138 forms the cathode, the contact 147*a* of the diffusion region 142 forms a terminal of the anode, and a contact 147*c* of the diffusion region 138 forms a terminal of the cathode. Note that if the transistor 101 is a PMOS, the anode and cathodes would be reversed.

FIG. 2 schematically illustrates (e.g., using dotted lines) example connections of various contacts of the devices 100 and 200 of FIG. 1A, in accordance with an embodiment of the present disclosure. The connections of FIG. 2 assume that the transistor 101 is an NMOS. For example, in FIG. 2, the drain diffusion region 134 is coupled to an I/O terminal 180 of the IC chip, through which the IC chip may interface with devices external to the IC chip on which the device 100 is implemented. The 1/O terminal 180 may be any conventional I/O pad, pin, post, wire, etc. In an example, the transistor 101 may be part of a transmitter, a receiver, or a driver circuit coupled to the I/O terminal 180. In an example, ESD events (e.g., high ESD voltage and/or current) may occur in the I/O terminal 180.

The diffusion region 142 (e.g., the tap diffusion region) and the source diffusion region 138 are coupled to a ground terminal 182. Note that in the example of FIG. 2, because the diffusion regions 138 and 142 are both coupled to the ground and maintained at the same potential, the diode 155*b* (see FIG. 1B) may not be functional, and hence, not illustrated in FIG. 2.

In an example, individual connections may be implemented with corresponding one or more interconnect features, such as conductive vias and/or conductive lines, which are schematically depicted using dotted lines in FIG. 2. For example, one or more metallization levels of the integrated circuit chip may be used for the interconnections.

In an example, the diode 155*a* may be parasitic in nature, and is formed using the sub-fin 143. The diode 143 is formed by adding the tap diffusion region 142 contacting the sub-fin 143. In this configuration, in normal operating mode (e.g., when ESD events do not occur, and the I/O terminal 182 is at a reasonable operating voltage, e.g., less than a breakdown voltage of the diode 155*a*), the ESD diode 155*a* conducts very little leakage current because of the grounded anode (e.g., the diffusion region 142 coupled to ground terminal 182). In case of high ESD voltage and/or current occurring in the I/O terminal 180, the high voltage of the cathode (e.g., the drain diffusion region 134) results in breakdown of the diode 155*a*, and the high voltage and/or the current from the I/O terminal 180 is grounded through the diffusion region 142, which is the anode of the diode 155*a*. Thus, the parasitic diode 155*a* facilitates in ESD protection of the transistor 101.

Note that if the transistor 101 is a PMOS instead of an NMOS, the drain diffusion region 134 would be coupled to the I/O terminal and may form the anode. The source diffusion region and the tap diffusion region 142 may be coupled to a power supply terminal, and the tap diffusion region 142 may form the cathode. The polarity of the diode 155*a* would be reversed in this case.

In an example, the diffusion regions 234, 238 of the device 200 (e.g., which may be the source and drain regions of the transistor device 200) are coupled to terminals 280 of a logic circuit, e.g., as illustrated in FIG. 2. Thus, referring again to FIG. 2, while the diffusion region 134 of the device 100 is coupled to the I/O terminal 180, the diffusion regions 234, 238 of the device 200 are coupled to the logic terminals 280. Also, ESD events generally occurs at the I/O terminal, and ESD events do not generally occur at the logic terminals 280. This is because the logic terminals 280 are internal to the IC chip, whereas the I/O terminal 180 is coupled to outside circuits, thereby increasing chances of ESD events at the I/O terminal 180. In an example, the diode 155*a* protects components coupled to the I/O 180 from such ESD events. However, as ESD events do not occur at the logic terminals 280, the device 200 may not need a diode integrated with the transistor device 200.

Figure 4:
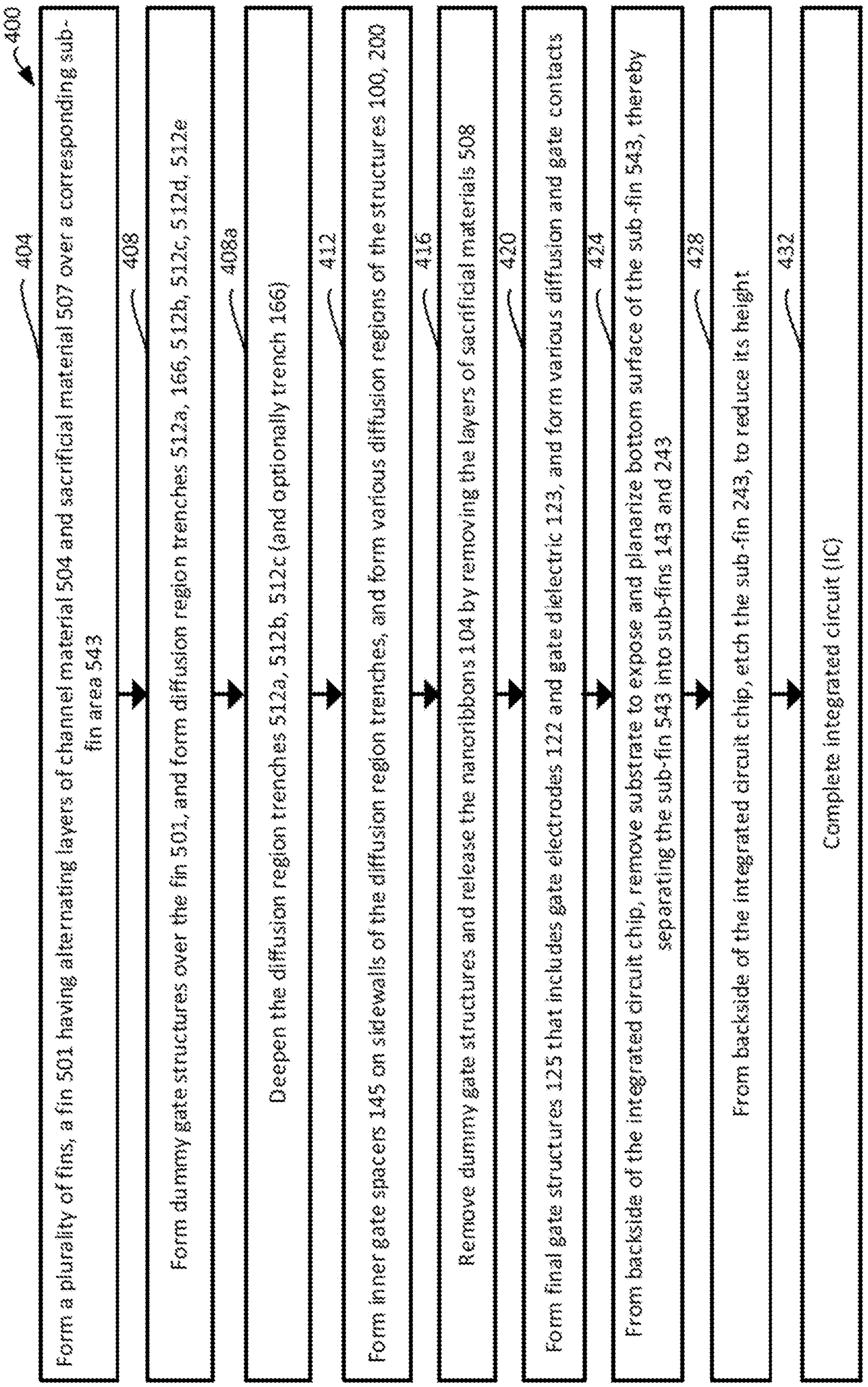
FIG. 4 illustrates a flowchart depicting a method of forming a portion of the integrated circuits of FIGS. 1A-3, in accordance with an embodiment of the present disclosure.

FIG. 4 illustrates a flowchart depicting a method 400 of forming a portion of the integrated circuits 10 and 10*a* of FIGS. 1A-3, in accordance with an embodiment of the present disclosure. FIGS. 5A, 5B, 5C, 5C1, 5C2, 5D, 5E, 5F, 5G, and 5H collectively illustrate cross-sectional views of the portion of the integrated circuits 10 and 10*a* in various stages of processing in accordance with the methodology 400 of FIG. 4, in accordance with an embodiment of the present disclosure. FIGS. 4 and 5A-5H will be discussed in unison.

Referring to FIG. 4, the method 400 includes, at 404, from frontside of the integrated circuit chip, forming a plurality of fins, where a fin 501 (e.g., illustrated in FIG. 5A) has alternating layers of channel material 504 and sacrificial material 507 over a corresponding sub-fin area 543. The various layers of the fin may be formed using an appropriate deposition process, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. In an example, the sacrificial material 508 may comprise a semiconductor material, such as SiGe, that is etch selective with respect to the channel material 504 (e.g., Si, or other appropriate semiconductor material, discussed above). For example, an etch process to remove the sacrificial material 508 may not substantially etch the channel material 504.

Referring again to FIG. 4, the method 400 then proceeds from 404 to 408, which includes forming dummy gate structures over the fin 501 (e.g., see FIG. 5B), and forming diffusion region trenches 512*a*, 166, 512*b*, 512*c*, 512*d*, 512*e* within the fin 501 (e.g., see FIG. 5C). In an example, each dummy gate structure comprises dummy gate oxide (not labelled in FIG. 5B), dummy gate electrode 525 (e.g., comprising polysilicon, for example), and gate spaces 149. In one embodiment, forming the dummy gate structure may include deposition of a dummy gate oxide, and deposition of a dummy gate electrode 525 (e.g., poly-Si). Gate spacers 149 are formed along opposite sides of the dummy gate electrode 525. For example, the gate spacers 149 comprise silicon nitride ($Si_3N_4$) and/or other suitable dielectric material, as will be appreciated. The dummy gates are formed in positions where the final metal gates are to be eventually formed for the structures 100 and 200.

Formation of the diffusion region trenches may be performed using an appropriate etch process. Note that as illustrated, the diffusion region trench formation may also make an undercut in a portion of the sub-fin 543 that is between the devices 100 and 200. For example, a rightmost dummy gate of the device 100 and a leftmost dummy gate of the device 200 are spaced sufficiently apart to cause the undercut, as illustrated in FIG. 5C. Also, the various diffusion region trenches divide the stack of channel material 504 into multiple stacks comprising nanoribbons 104*a*, 104*b*, . . . , 104*e*, 204*c*, 204*d*, 204*e* of the structures 100 and 200, interleaved with the sacrificial material 508.

As illustrated, the trenches 512*a*, 166, 512*b*, 512*c*, 512*d*, 512*e* extend within the sub-fin 543 by a substantially equal depth of d2 (discussed with respect to FIG. 1A), which may be intentional, or as an unintentional consequence of the trench etch process. For example, now the lower surfaces of one or more (e.g., all) of the trenches 512*a*, 166, 512*b*, 512*c*, 512*d*, 512*e* are on the above discussed horizontal plane 177*c*.

Referring again to FIG. 4, the method 400 then proceeds from 408 to 408*a*, which includes deepening the diffusion region trenches 512*a*, 512*b*, 512*c*, and optionally trench 166, as illustrated in FIGS. 5C1 and 5C2.

Referring to FIG. 5C1, diffusion region trenches 512*a*, 512*b*, 512*c*, 166 of the device 100 are deepened, without deepening the trenches 512*d*, 512*e*. In an example, the trenches 512*d*, 512*e* may be covered by a mask 507, e.g., when the diffusion region trenches 512*a*, 512*b*, 512*c*, 166 of the device 100 are being deepened, as illustrated in FIG. 5C1. For example, the diffusion region trenches 512*a*, 512*b*, 512*c*, 166 of the device 100 are deepened such that the lower surfaces of the diffusion region trenches 512*a*, 512*b*, 512*c*, 166 are substantially at the above discussed horizontal plane 177*b* (see FIG. 1A). For example, each of the diffusion region trenches 512*a*, 512*b*, 512*c*, 166 of the device 100 now extend to a depth d1 within the sub-fin 543, as illustrated in FIG. 5C1, and such uniform deepening results in eventual formation of the integrated circuit 10 of FIG. 1A.

In FIGS. 5C1, all the diffusion region trenches 512*a*, 512*b*, 512*c*, 166 of the device 100 are deepened, such that later formed diffusion regions 142, 134, 138 can make better electrical contact with the sub-fin 143. However, as no diffusion region is to be later formed within the trench 166, there may not be a need to deepen the trench 166. Accordingly, as illustrated in FIG. 5C2, the trench 166 may also be masked off (e.g., by mask 507*a*) when deepening the diffusion region trenches 512*a*, 512*b*, 512*c*, such that the trench 166 is not deepened, resulting in eventual formation of the integrated circuit 10*a* of FIG. 3.

Figure 5D:
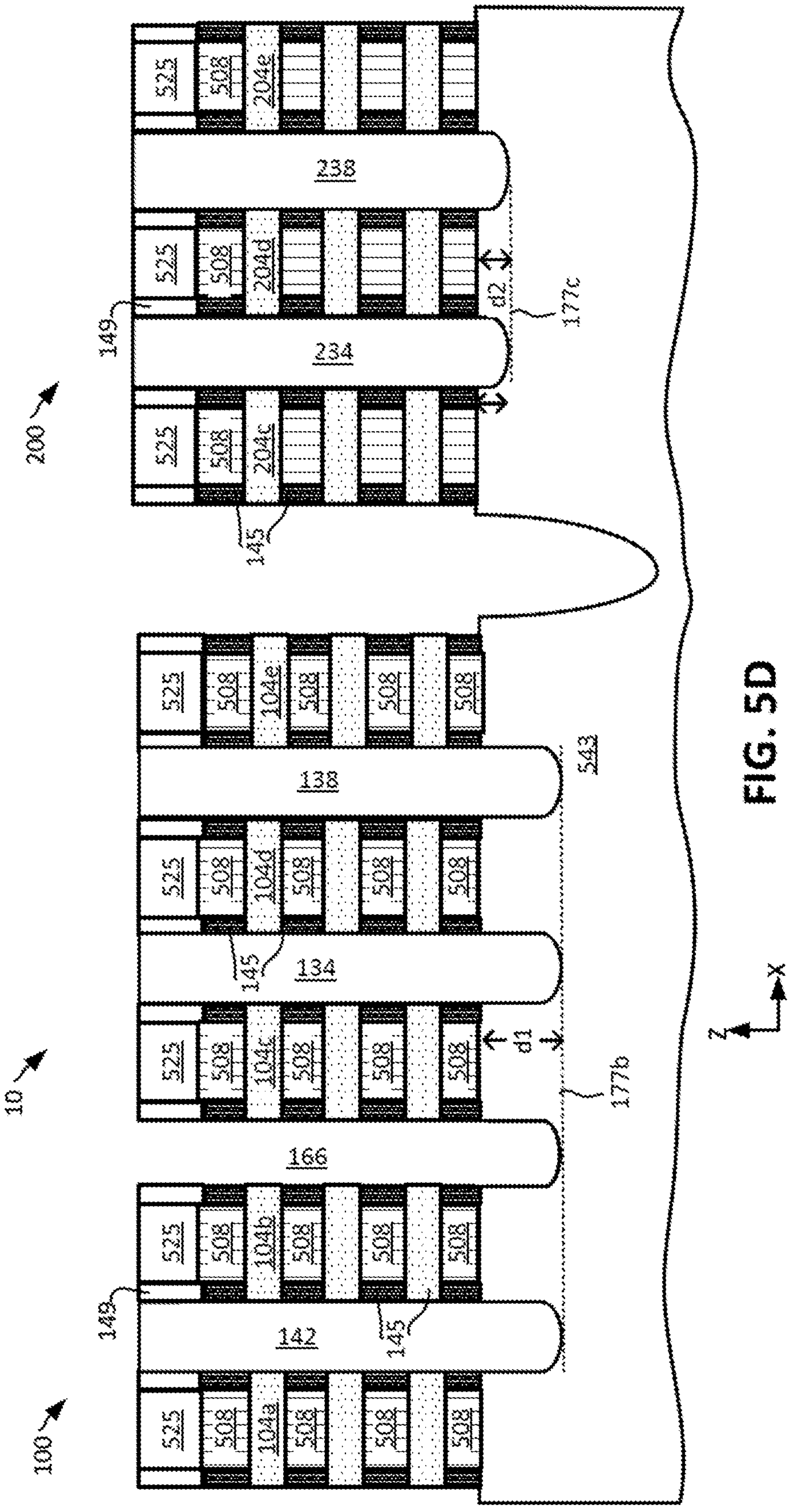

Referring again to FIG. 4, the method 400 then proceeds from 408 to 412, where inner gate spacers 145 are formed on sidewalls of the diffusion region trenches, and then various diffusion regions of the structures 100, 200 are formed, as illustrated in FIG. 5D. Note that prior to the process 412, the mask 507 and mask 507*a* of FIG. 5C1-5C2 are removed, e.g., etched away. In an example, the inner gate spacers 145 may be formed using processes used to form such inner gate spacers in GAA transistors. For example, end portions of the sacrificial materials 508 of FIG. 5C1 or 5C2 are etched (e.g., using a wet etch that uses nitric acid/hydrofluoric acid, an anisotropic dry etch, or other suitable etch process) through the trenches 512*a*, 166, 512*b*, 512*c*, 512*d*, 512*e*, to form corresponding recesses, and the inner gate spacers 145 are deposited using an appropriate deposition technique (e.g., CVD, PVD, ALD, VPE, MBE, or LPE, for example) within the thus formed recesses. The deposited inner gate spacers 145 may be planarized, such that tips of the channel materials 104 are exposed through the diffusion region trenches.

Subsequently, diffusion regions 142, 134, 138, 234, and 238 are formed within the trenches 512*a*, 512*b*, 512*c*, 512*d*, 512*e*, respectively, e.g., as illustrated in FIG. 5D. In an example, the diffusion regions are formed epitaxially within the corresponding trenches. In some embodiments, the diffusion regions may include any suitable doping scheme, such as including suitable n-type and/or p-type dopant (e.g., in a concentration in the range of 1E16 to 1E22 atoms per cubic cm), as discussed above. Dopant types of various diffusion regions have been discussed herein above.

In an example, when forming one or more diffusion regions having p-type dopant, trenches for diffusion regions having n-type dopant are being masked off, and similarly, when forming one or more diffusion regions having n-type dopant, trenches for diffusion regions having p-type dopant are being masked off, e.g., such that individual diffusion region may be appropriately doped with either p or n type dopant. For example, diffusion region 142 has opposite type of dopant relative to the diffusion regions 134, 138. Accordingly, in an example, when forming the diffusion regions 134, 138, the trench for the diffusion region 142 is masked off, and vice versa. Note that no diffusion region is grown within the trench 166. For example, this trench 166 may be masked off when forming the various other diffusion regions.

Figure 5E:
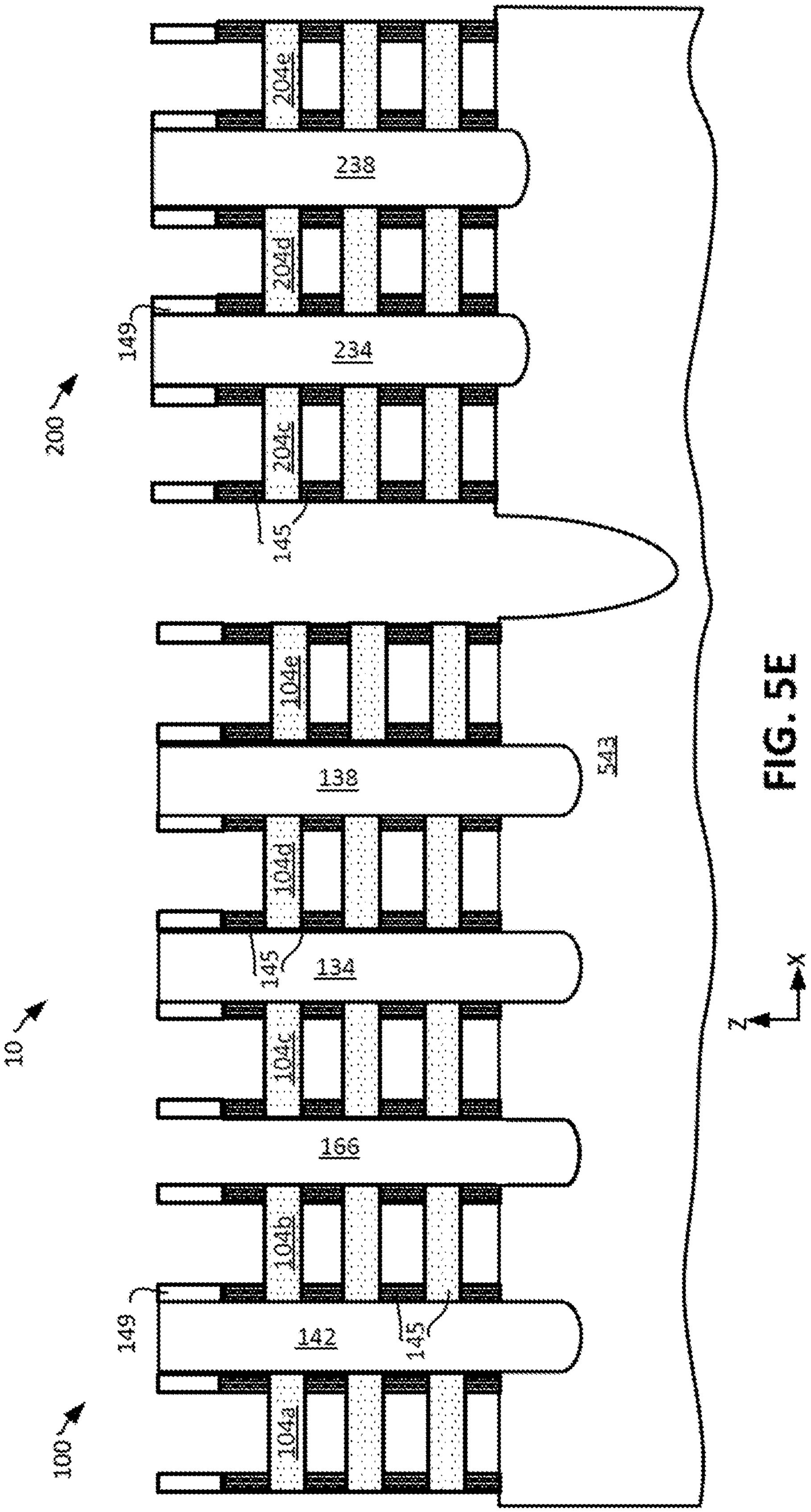

Referring again to FIG. 4, the method 400 then proceeds from 412 to 416, where the dummy gate structures are removed, and the nanoribbons 104 are released by removing the layers of sacrificial materials 508, as illustrated in FIG. 5E. In an example, the dummy gate materials (such as dummy gate dielectric and dummy gate electrodes 525) are removed via an etch process that is selective to the gate spacers 149 and inner gate spacers 145 and other non-gate materials exposed during channel and gate processing. Removing the dummy gate electrode between the gate spacers exposes the channel region of the fin. For example, a polycrystalline silicon dummy gate electrode can be removed using a wet etch process (e.g., nitric acid/hydrofluoric acid), an anisotropic dry etch, or other suitable etch process, as will be appreciated. At this stage of processing, the layer stack of alternating layers of channel material and sacrificial material is exposed in the channel region.

The sacrificial material 508 in the layer stack can then be removed by etch processing, to release the nanoribbons 104, in accordance with some embodiments. Etching the sacrificial material 508 may be performed using any suitable wet or dry etching process such that the etch process selectively removes the sacrificial material and leaves intact the channel material. In one embodiment, the sacrificial material is silicon germanium (SiGe) and the channel material is electronic grade silicon (Si). For example, a gas-phase etch using an oxidizer and hydrofluoric acid (HF) has shown to selectively etch SiGe in SiGe/Si layer stacks. In another embodiment, a gas-phase chlorine trifluoride ($ClF_3$) etch is used to remove the sacrificial SiGe material. The etch chemistry can be selected based on the germanium concentration, nanoribbon dimensions, and other factors, as will be appreciated. After removing the SiGe sacrificial material, the resulting channel region includes silicon nanoribbons extending from corresponding diffusion region, where at least one end of each nanoribbon 104 (e.g., silicon) contacts a corresponding diffusion region.

Figure 5F:
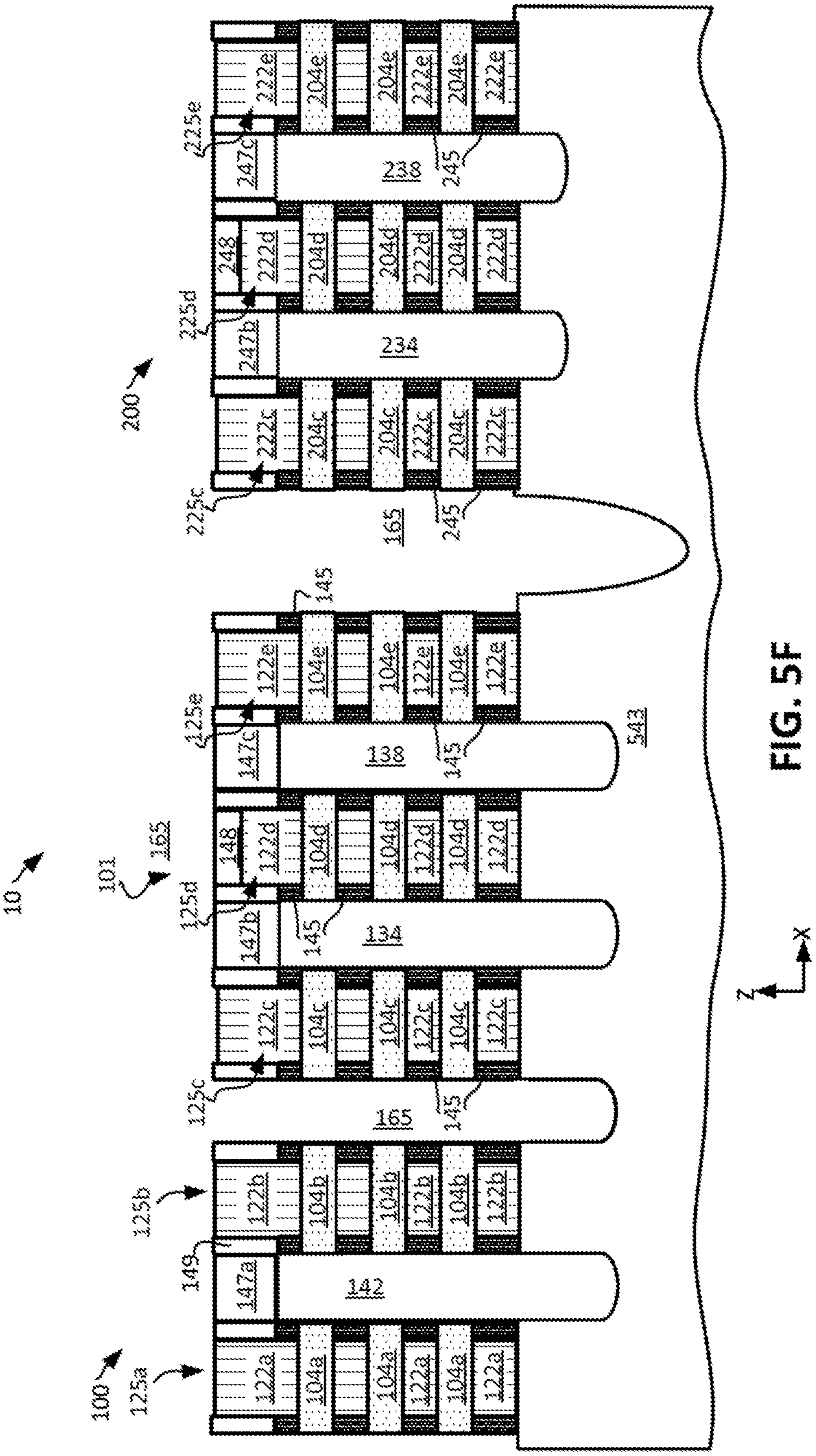

Referring again to FIG. 4, the method 400 then proceeds from 416 to 420, where the final gate structures 125 including gate electrodes 122 and gate dielectric 123 are formed, as illustrated in FIG. 5F, e.g., using processes for forming replacement gate structures in GAA devices. Also, various diffusion and gate contacts are formed, as also illustrated in FIG. 5F. Note that the gate dielectric 123 is not separately labelled in FIG. 5F, and FIG. 5F shows the gate electrodes 122. However, the expanded view of a portion 119 of FIG. 1A illustrates and labels the gate dielectric 123.

Figure 5G:
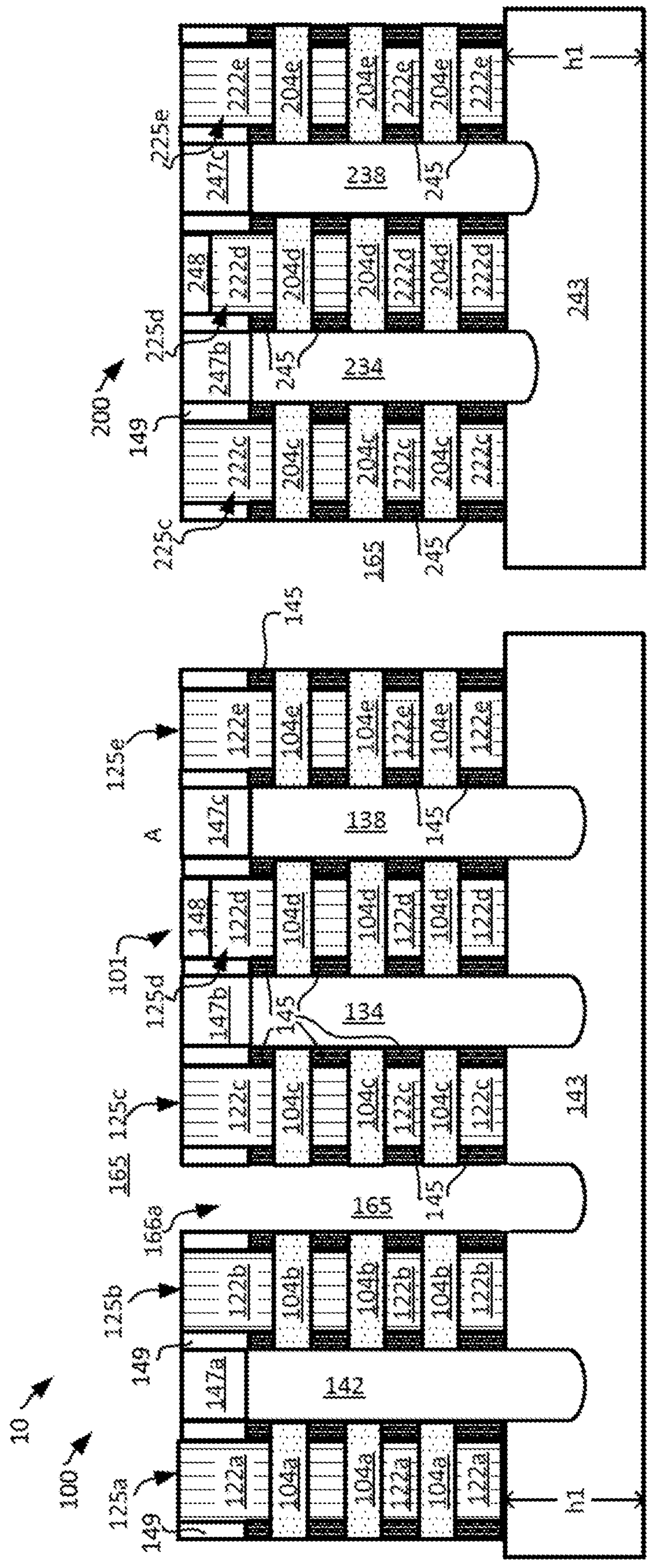

Referring again to the method 400 of FIG. 4, the method 400 proceeds from 420 to 424. At 424, from backside of the integrated circuit chip, the substrate is removed, to expose and planarize bottom surface of the sub-fin 543, thereby separating the sub-fin 543 into sub-fins 143, as illustrated in FIG. 5G. For example, the integrated circuit chip is flipped upside down (although the flipping is not illustrated in FIG. 5G, and the integrated circuit chip is shown in its original orientation), and the backside of the integrated circuit chip is processed from the top. Polishing the sub-fin may reduce the height of the sub-fin, resulting in the separation of the sub-fin.

Figure 5H:
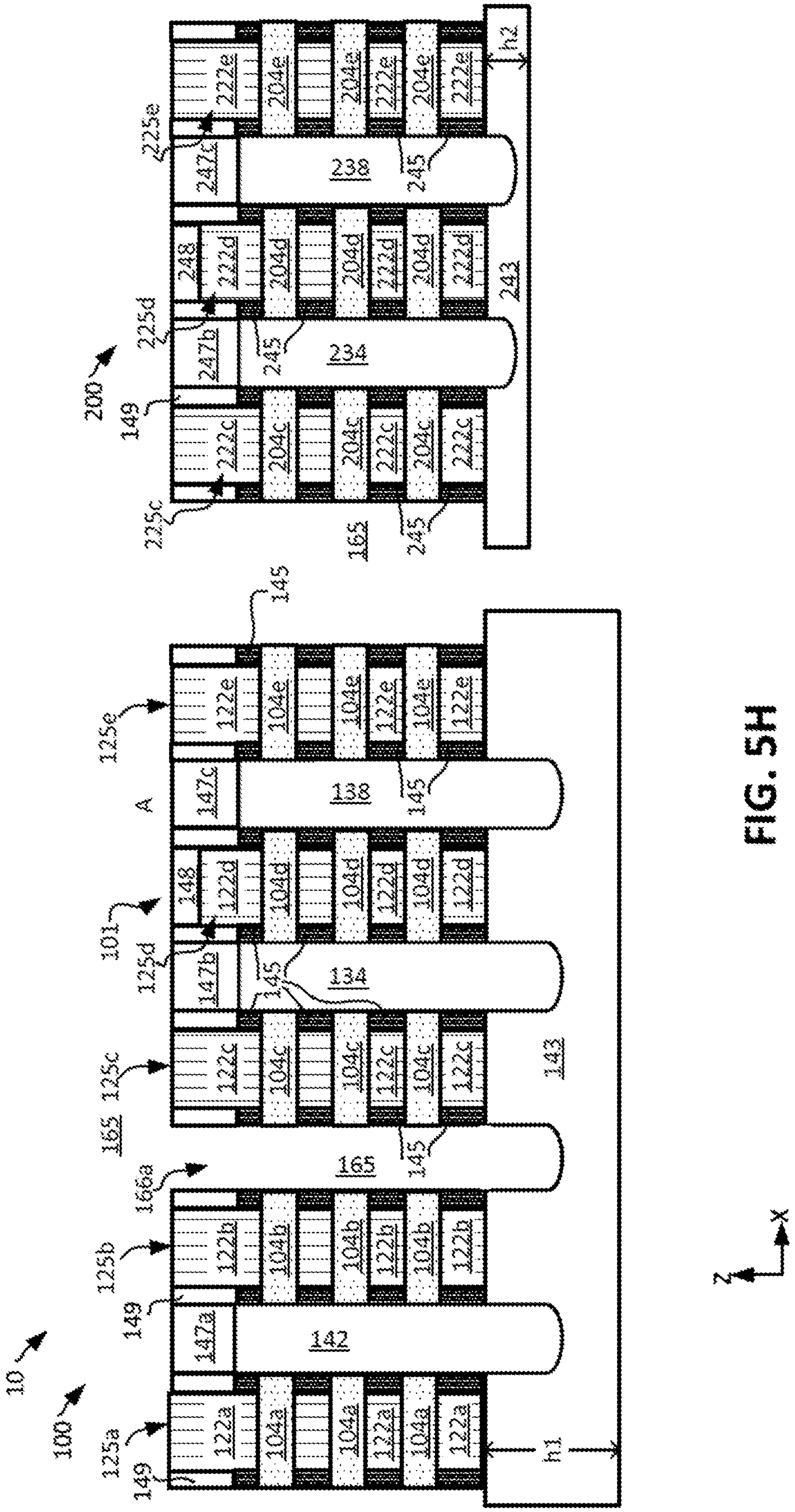

Referring again to the method 400 of FIG. 4, the method 400 proceeds from 424 to 428. At 428, from backside of the integrated circuit chip, the sub-fin 243 is further etched, to reduce its height to h2, as illustrated in FIG. 5H, in an example. Note that in another example, the sub-fin 243 may be completely removed, and replaced with another component 243 which may be a substrate or dielectric material. For example, because there is no need of a sub-fin in the device 200, the height of the sub-fin 243 may be reduced, or the sub-fin 243 may be replaced. However, as the sub-fin 143 is used to form the previously discussed ESD protection diodes 155, the sub-fin 143 is preserved. Removing and/or reducing height of the sub-fin 243, for example, generates space for backside interconnect features to be used for various signal and power routings. In an example, during process 428, a backside etch block layer, such as a hard mask on the backside, is used to prevent any substantial etching of the sub-fin 143, when the sub-fin 243 of the device 200 is being etched.

The method 400 of FIG. 4 then proceeds from 428 to 432, where a general integrated circuit (IC) is completed, as desired, in accordance with some embodiments. Such additional processing to complete an IC may include back-end or back-end-of-line (BEOL) processing to form one or more metallization layers and/or to interconnect the transistor devices formed, for example. Any other suitable processing may be performed, as will be apparent in light of this disclosure.

Note that the processes in method 400 are shown in a particular order for ease of description. However, one or more of the processes may be performed in a different order or may not be performed at all (and thus be optional), in accordance with some embodiments. Numerous variations on method 400 and the techniques described herein will be apparent in light of this disclosure.

Example System

Figure 6:
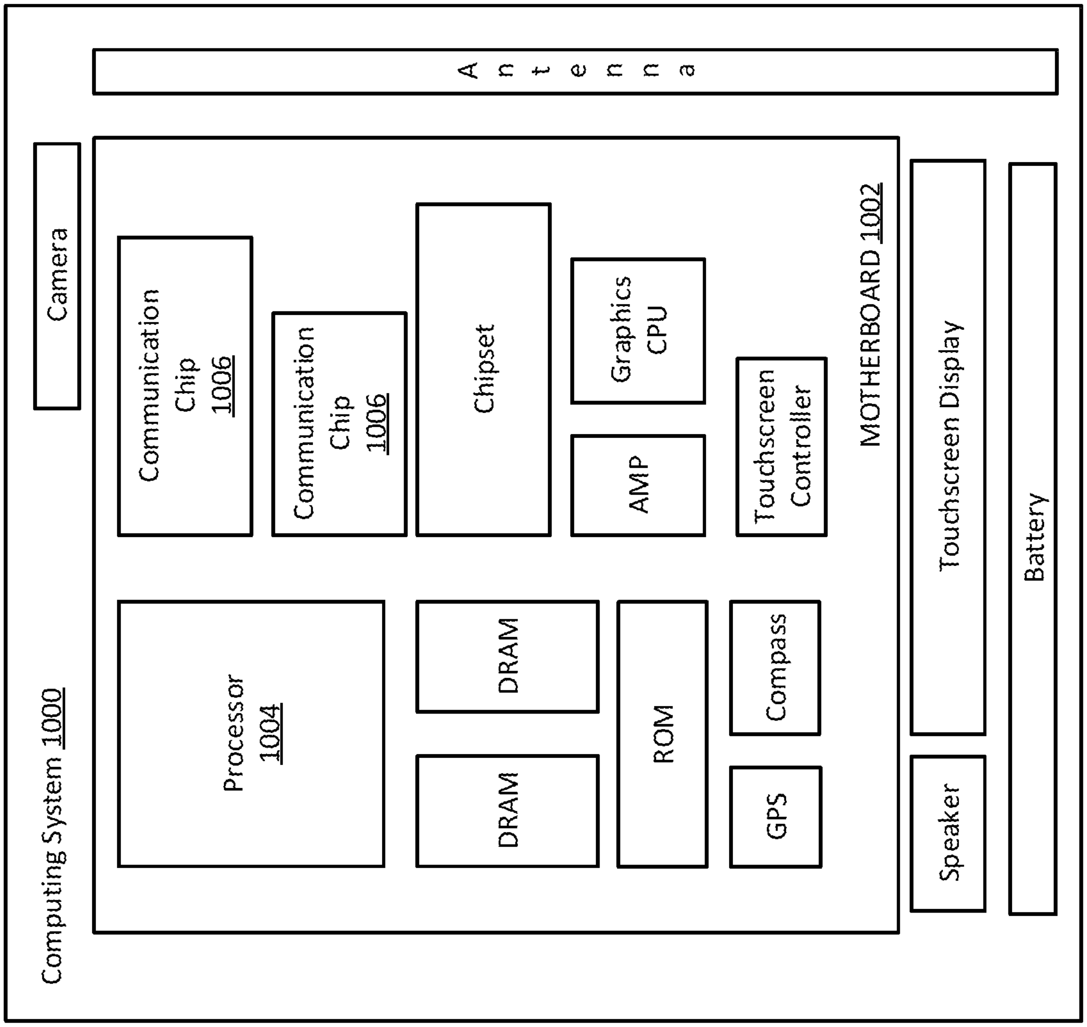
FIG. 6 illustrates a computing system implemented with integrated circuit structures (such as the diode structures illustrated in FIGS. 1A-3B) formed using the techniques disclosed herein, in accordance with some embodiments of the present disclosure.

FIG. 6 illustrates a computing system 1000 implemented with integrated circuit structures formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1. An integrated circuit structure comprising: a first device comprising (i) a first diffusion region, (ii) a first body comprising semiconductor material extending laterally from the first diffusion region, and (iii) a first gate structure on the first body, wherein the first diffusion region has a lower section that extends below a lower surface of the first gate structure, the lower section of the first diffusion region having a first vertical height; and a second device laterally adjacent to the first device, the second device comprising (i) a second diffusion region, (ii) a second body comprising semiconductor material extending laterally from the second diffusion region, and (iii) a second gate structure on the second body, wherein the second diffusion region has a lower section that extends below a lower surface of the second gate structure, the lower section of the second diffusion region having a second vertical height; wherein the first vertical height is at least 2 nanometers (nm) greater than the second vertical height.

Example 2. The integrated circuit structure of example 1, wherein: the first device further comprises a first sub-fin, wherein the first diffusion region is in contact with and extends within the first sub-fin; the second device further comprises a second sub-fin, wherein the second diffusion region is in contact with and extends within the second sub-fin; and a vertical height of the first sub-fin is greater than a vertical height of the second sub-fin by at least 2 nm.

Example 3. The integrated circuit structure of example 2, wherein: the lower section of the first diffusion region extends within the first sub-fin; and the lower section of the second diffusion region extends within the second sub-fin.

Example 4. The integrated circuit structure of any one of examples 1-3, wherein the first device further comprises: a third diffusion region; and a trench comprising dielectric material, the trench laterally between the first and third diffusion regions; wherein a lower section of each of the third diffusion region and the trench, which extends below the lower surface of the first gate structure, has a vertical height that is within 1 nm of the first vertical height; and Example 5. The integrated circuit structure of example 4, wherein the first device further comprises: a sub-fin, wherein the lower section of each of the first diffusion region, the third diffusion region, and the trench extends within the sub-fin.

Example 6. The integrated circuit structure of any one of examples 1-5, wherein the first device further comprises: a sub-fin, wherein the lower section of the first diffusion region extends within the sub-fin, wherein the first device is an Electrostatic Discharge (ESD) protection device configured to conduct current through the sub-fin to a ground terminal, during an ESD event at an input/output (I/O) terminal of the integrated circuit structure, the I/O terminal coupled to the first diffusion region.

Example 7. The integrated circuit structure of any one of examples 1-6, wherein the first device is an Electrostatic Discharge (ESD) protection device configured to conduct current during an ESD event occurring at an input/output (I/O) terminal of the integrated circuit structure, the I/O terminal coupled to the first diffusion region.

Example 8. The integrated circuit structure of any one of examples 1-7, wherein: the lower surface of the first gate structure is at least in part on a first horizontal plane; the lower surface of the second gate structure is at least in part on a second horizontal plane; and the first horizontal plane is vertically separated from the second horizontal plane by at most 1 nm.

Example 9. The integrated circuit structure of any one of examples 1-8, wherein: a lower surface of the lower section of the first diffusion region is at least in part on a first horizontal plane; a lower surface of the lower section of the second diffusion region is at least in part on a second horizontal plane; and the first horizontal plane is vertically separated from the second horizontal plane by at least 2 nm.

Example 10. The integrated circuit structure of example 9, wherein the first horizontal plane is vertically lower than the second horizontal plane by at least 2 nm.

Example 11. The integrated circuit structure of any one of examples 1-10, wherein the first diffusion region is any of a source region, a drain region, or a tap region that is to couple the sub-fin to an external circuit.

Example 12. The integrated circuit structure of any one of examples 1-11, wherein the second diffusion region is any of a source region or a drain region of a transistor.

Example 13. The integrated circuit structure of any one of examples 1-12, wherein the first vertical height is at least 5 nm greater than the second vertical height.

Example 14. The integrated circuit structure of any one of examples 1-13, wherein each of the first and second bodies is a nanoribbon, a nanowire, a nanosheet, or a fin.

Example 15. An integrated circuit structure comprising: a first device comprising (i) a first sub-fin, and (ii) a first diffusion region in contact with and extending in part within the first sub-fin, wherein a portion of the first diffusion region extending within the first sub-fin has a first height; and a second device laterally adjacent to the first device, the second device comprising (i) a second sub-fin, and (ii) a second diffusion region in contact with and extending in part within the second sub-fin, wherein a portion of the second diffusion region extending within the second sub-fin has a second height; wherein the first height is at least 2 nanometers (nm) greater than the second height.

Example 16. The integrated circuit structure of example 15, wherein: the first device further comprises (i) a first body comprising semiconductor material extending laterally from the first diffusion region, and (ii) a first gate structure on the first body; the second device further comprises (i) a second body comprising semiconductor material extending laterally from the second diffusion region, and (ii) a second gate structure on the second body; a lower surface of the first gate structure is at least in part on a first horizontal plane; a lower surface of the second gate structure is at least in part on a second horizontal plane; and the first horizontal plane is vertically separated from the second horizontal plane by at most 1 nm.

Example 17. The integrated circuit structure of example 16, wherein each of the first and second bodies is a nanoribbon, a nanowire, a nanosheet, or a fin.

Example 18. The integrated circuit structure of any one of examples 15-17, wherein: an upper surface of the first sub-fin is at least in part on a first horizontal plane; an upper surface of the second sub-fin is at least in part on a second horizontal plane; and the first horizontal plane is vertically separated from the second horizontal plane by at most 1 nm.

Example 19. The integrated circuit structure of any one of examples 15-18, wherein a vertical height of the first sub-fin is greater than a vertical height of the second sub-fin by at least 2 nm.

Example 20. An integrated circuit structure comprising: a first device comprising (i) a sub-fin, (ii) first one or more diffusion regions in contact with the sub-fin, and (iii) a trench laterally adjacent to the first one or more diffusion regions, the trench comprising dielectric material and having (a) an upper section extending upward from the sub-fin, and (b) a lower section extending within the sub-fin, wherein the lower section of the trench has a first vertical height; and a second device laterally adjacent to the first device, the second device comprising (i) a second diffusion region, (ii) a body comprising semiconductor material extending laterally from the second diffusion region, and (iii) a gate structure on the body, wherein the second diffusion region has a lower section that extends below a lower surface of the second gate structure, the lower section of the second diffusion region having a second vertical height; wherein the first vertical height is at least 2 nanometers (nm) greater than the second vertical height.

Example 21. The integrated circuit structure of example 20, wherein: the gate structure is a first gate structure; the first one or more diffusion regions comprises at least a third diffusion region and a fourth diffusion region; the first device further comprises (i) a second gate structure adjacent to the third diffusion region and (ii) a third gate structure adjacent to the fourth diffusion region; and the trench comprising dielectric material is laterally between and separates the third and fourth gate structures.

Example 22. The integrated circuit structure of example 21, wherein the body is a first body, and wherein the first device further comprises: a second body comprising semiconductor material extending laterally from the third diffusion region towards the fourth diffusion region, the second gate structure on the second body; and a third body comprising semiconductor material extending laterally from the fourth diffusion region towards the third diffusion region, the third gate structure on the third body; wherein each of the second and third bodies is in contact with the dielectric material within the trench.

Example 23. The integrated circuit structure of any one of examples 21-22, wherein: at least one of the first one or more diffusion regions has (a) an upper section extending upward from the sub-fin, and (b) a lower section extending within the sub-fin, wherein the lower section of the at least one of the first one or more diffusion regions has a third vertical height; and the third vertical height is at least 2 nm greater than the second vertical height.

Example 24. The integrated circuit structure of example 23, wherein the third vertical height is within 1 nm of the first vertical height.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit structure comprising:

a first device comprising (i) a first diffusion region, (ii) a first body comprising semiconductor material extending laterally from the first diffusion region, (iii) a first gate structure on the first body, and (iv) a first sub-fin having a bottom surface directly on a dielectric material, wherein the first diffusion region has a lower section that extends within the first sub-fin below a lower surface of the first gate structure, the lower section of the first diffusion region having a first vertical height; and a second device laterally adjacent to the first device, the second device comprising (i) a second diffusion region, (ii) a second body comprising semiconductor material extending laterally from the second diffusion region, (iii) a second gate structure on the second body, and (iv) a second sub-fin having a bottom surface directly on the dielectric material, wherein the second diffusion region has a lower section that extends within the second sub-fin below a lower surface of the second gate structure, the lower section of the second diffusion region having a second vertical height;

wherein the first vertical height is at least 2 nanometers (nm) greater than the second vertical height, and wherein a vertical height of the first sub-fin is greater than a vertical height of the second sub-fin by at least 2 nm.

2. The integrated circuit structure of claim 1, wherein:

the first diffusion region is in direct contact with the first sub-fin; and the second diffusion region is in direct contact with the second sub-fin.

3. The integrated circuit structure of claim 1, wherein the first device further comprises:

a third diffusion region; and a trench comprising dielectric material, the trench laterally between the first and third diffusion regions;

wherein a lower section of each of the third diffusion region and the trench, which extends below the lower surface of the first gate structure, has a vertical height that is within 1 nm of the first vertical height.

4. The integrated circuit structure of claim 3, wherein the lower section of each of the third diffusion region and the trench extends within the first sub-fin.

5. The integrated circuit structure of claim 1, wherein the first device is an Electrostatic Discharge (ESD) protection device configured to conduct current through the first sub-fin to a ground terminal, during an ESD event at an input/output (I/O) terminal of the integrated circuit structure, the I/O terminal coupled to the first diffusion region.

6. The integrated circuit structure of claim 1, wherein the first device is an Electrostatic Discharge (ESD) protection device configured to conduct current during an ESD event occurring at an input/output (I/O) terminal of the integrated circuit structure, the I/O terminal coupled to the first diffusion region.

7. The integrated circuit structure of claim 1, wherein:

the lower surface of the first gate structure is at least in part on a first horizontal plane;

the lower surface of the second gate structure is at least in part on a second horizontal plane; and the first horizontal plane is vertically separated from the second horizontal plane by at most 1 nm.

8. The integrated circuit structure of claim 1, wherein:

a lower surface of the lower section of the first diffusion region is at least in part on a first horizontal plane;

a lower surface of the lower section of the second diffusion region is at least in part on a second horizontal plane; and the first horizontal plane is vertically separated from the second horizontal plane by at least 2 nm.

9. The integrated circuit structure of claim 1, wherein the first diffusion region is any of a source region, a drain region, or a tap region that is configured to couple the first sub-fin to an external circuit.

10. The integrated circuit structure of claim 1, wherein the second diffusion region is any of a source region or a drain region of a transistor.

11. The integrated circuit structure of claim 1, wherein the first vertical height is at least 5 nm greater than the second vertical height.

12. The integrated circuit structure of claim 1, wherein each of the first and second bodies is a nanoribbon, a nanowire, a nanosheet, or a fin.

13. An integrated circuit structure comprising:

a first device comprising (i) a first sub-fin, (ii) a first diffusion region in contact with and extending in part within the first sub-fin, (iii) a second diffusion region, and (iv) a trench comprising dielectric material and laterally between the first and second diffusion regions, wherein a portion of the first diffusion region extending within the first sub-fin has a first height, and wherein a lower section of each of the second diffusion region and the trench, which extends within the first sub-fin, has a height that is within 1 nm of the first height; and a second device laterally adjacent to the first device, the second device comprising (i) a second sub-fin, and (ii) a third diffusion region in contact with and extending in part within the second sub-fin, wherein a portion of the third diffusion region extending within the second sub-fin has a second height;

wherein the first height is at least 2 nanometers (nm) greater than the second height.

14. The integrated circuit structure of claim 13, wherein:

the first device further comprises (i) a first body comprising semiconductor material extending laterally from the first diffusion region, and (ii) a first gate structure on the first body;

the second device further comprises (i) a second body comprising semiconductor material extending laterally from the third diffusion region, and (ii) a second gate structure on the second body;

a lower surface of the first gate structure is at least in part on a first horizontal plane;

a lower surface of the second gate structure is at least in part on a second horizontal plane; and the first horizontal plane is vertically separated from the second horizontal plane by at most 1 nm.

15. The integrated circuit structure of claim 13, wherein a vertical height of the first sub-fin is greater than a vertical height of the second sub-fin by at least 2 nm.

16. An integrated circuit structure comprising:

a first device comprising (i) a sub-fin, (ii) first one or more diffusion regions in contact with the sub-fin, and (iii) a trench laterally adjacent to the first one or more diffusion regions, the trench comprising dielectric material and having (a) an upper section extending upward from the sub-fin, and (b) a lower section extending within the sub-fin, wherein the lower section of the trench has a first vertical height; and a second device laterally adjacent to the first device, the second device comprising (i) a second diffusion region, (ii) a body comprising semiconductor material extending laterally from the second diffusion region, and (iii) a gate structure on the body, wherein the second diffusion region has a lower section that extends below a lower surface of the second gate structure, the lower section of the second diffusion region having a second vertical height;

wherein the first vertical height is at least 2 nanometers (nm) greater than the second vertical height.

17. The integrated circuit structure of claim 16, wherein:

the gate structure is a first gate structure;

the first one or more diffusion regions comprises at least a third diffusion region and a fourth diffusion region;

the first device further comprises (i) a second gate structure adjacent to the third diffusion region and (ii) a third gate structure adjacent to the fourth diffusion region; and the trench comprising dielectric material is laterally between and separates the third and fourth gate structures.

18. The integrated circuit structure of claim 17, wherein the body is a first body, and wherein the first device further comprises:

a second body comprising semiconductor material extending laterally from the third diffusion region towards the fourth diffusion region, the second gate structure on the second body; and a third body comprising semiconductor material extending laterally from the fourth diffusion region towards the third diffusion region, the third gate structure on the third body;

wherein each of the second and third bodies is in contact with the dielectric material within the trench.

19. The integrated circuit structure of claim 17, wherein:

at least one of the first one or more diffusion regions has (a) an upper section extending upward from the sub-fin, and (b) a lower section extending within the sub-fin, wherein the lower section of the at least one of the first one or more diffusion regions has a third vertical height; and the third vertical height is at least 2 nm greater than the second vertical height.

20. The integrated circuit structure of claim 13, wherein the first device is an Electrostatic Discharge (ESD) protection device configured to conduct current through the first sub-fin to a ground terminal, during an ESD event at an input/output (I/O) terminal of the integrated circuit structure, the I/O terminal coupled to the first diffusion region.

* * * * *